(12) United States Patent
Kihara

(10) Patent No.: US 8,072,292 B2
(45) Date of Patent: Dec. 6, 2011

(54) HIGH-FREQUENCY MODULE

(75) Inventor: Takashi Kihara, Ishikawa-gun (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/115,225

(22) Filed: May 25, 2011

(65) Prior Publication Data

US 2011/0221542 A1    Sep. 15, 2011

Related U.S. Application Data

(63) Continuation of application No. PCT/JP2009/005281, filed on Oct. 9, 2009.

(30) Foreign Application Priority Data

Dec. 10, 2008    (JP) .................................. 2008-314627

(51) Int. Cl.
  *H03H 7/46* (2006.01)
  *H03H 7/42* (2006.01)
  *H01P 5/12* (2006.01)

(52) U.S. Cl. .......................... 333/132; 333/126; 333/129

(58) Field of Classification Search ........... 333/126–135
See application file for complete search history.

(56) References Cited

U.S. PATENT DOCUMENTS

| | | | | |
|---|---|---|---|---|
| 7,242,268 B2 * | 7/2007 | Hagiwara et al. | ............ | 333/133 |
| 2004/0257172 A1 * | 12/2004 | Schmidhammer et al. | ... | 333/133 |
| 2006/0028298 A1 * | 2/2006 | Nakamura et al. | ............ | 333/133 |
| 2007/0296521 A1 * | 12/2007 | Schmidhammer | ............ | 333/133 |
| 2008/0284540 A1 * | 11/2008 | Nishihara et al. | ............ | 333/133 |

FOREIGN PATENT DOCUMENTS

| | | |
|---|---|---|
| EP | 2 131 493 A1 | 12/2009 |
| EP | 2 151 922 A1 | 2/2010 |
| JP | 2006-333168 A | 12/2006 |
| WO | 2008/146525 A1 | 12/2008 |
| WO | 2008/146552 A1 | 12/2008 |

OTHER PUBLICATIONS

Official Communication issued in International Patent Application No. PCT/JP2009/005281, mailed on Nov. 17, 2009.
Official Communication issued in corresponding Japanese Patent Application No. 2010-502378, mailed on Mar. 30, 2010.

* cited by examiner

*Primary Examiner* — Robert Pascal
*Assistant Examiner* — Kimberly Glenn
(74) *Attorney, Agent, or Firm* — Keating & Bennett, LLP

(57) ABSTRACT

A high-frequency module includes a balanced demultiplexer including a pair of balanced signal terminals and that has at least one of high differential isolation and high differential attenuation. A distance between an antenna terminal and a second balanced signal terminal provided on a mounting surface of a circuit board is greater than the antenna terminal and a first balanced signal terminal. On a back surface of the circuit board, a distance between a first back surface side electrode pad to which the antenna terminal is connected and a fourth back surface side electrode pad to which the second balanced signal terminal is connected is less than a distance between the first back surface side electrode pad to which the antenna terminal is connected and a third back surface side electrode pad to which the first balanced signal terminal is connected.

11 Claims, 29 Drawing Sheets

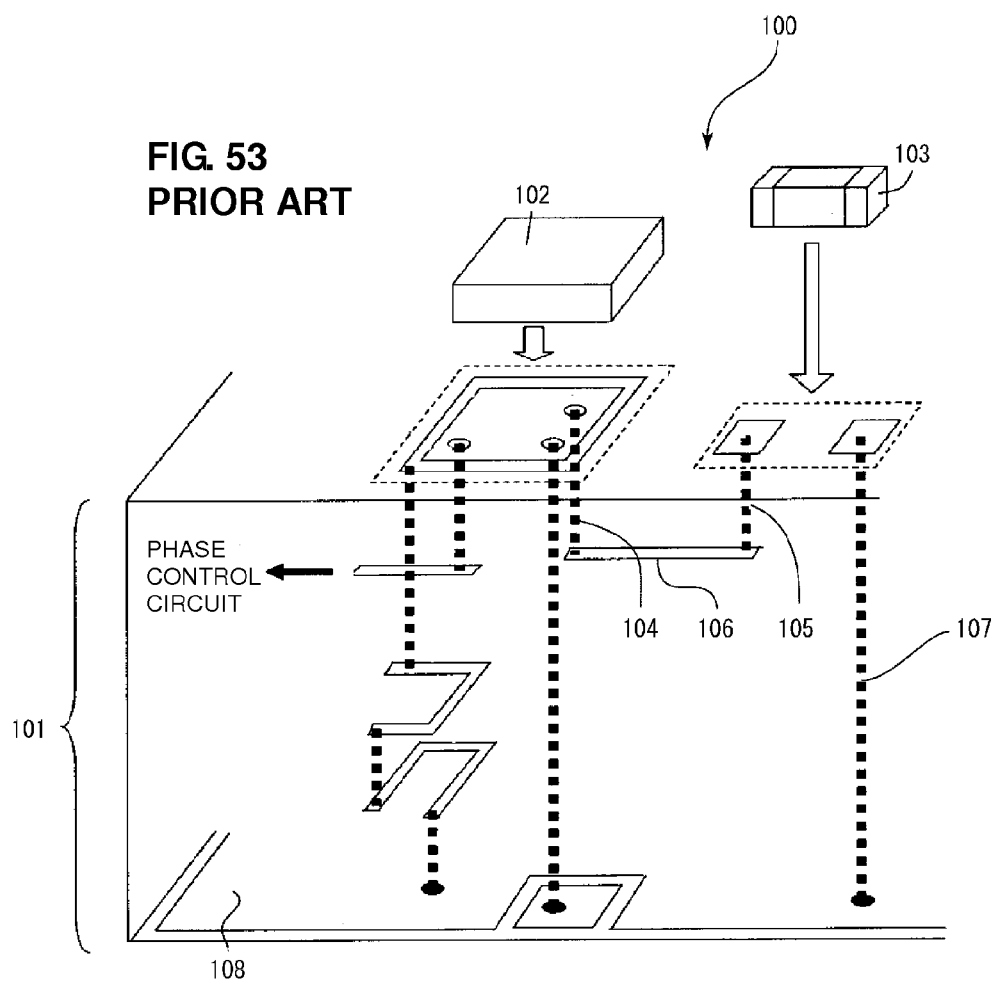

HIGH-FREQUENCY MODULE

BACKGROUND OF THE INVENTION

1. Field of the Invention

The present invention relates to a high-frequency module and, in particular, to a high-frequency module including a balanced demultiplexer including a pair of balanced signal terminals.

2. Description of the Related Art

In recent years, a demultiplexer including a plurality of filters, such as a receiving side filter and a transmitting side filter, has been widely used in communication terminals, such as cell phones. In such a demultiplexer, it is strongly desirable that the attenuation of a transmitting side filter and a receiving side filter be large in order to provide a high isolation characteristic between a transmitting side terminal and a receiving side terminal. Accordingly, various types of duplexers including a receiving side filter and a transmitting side filter having a high attenuation have been developed.

However, a problem has arisen in that, although the attenuation of a filter in a duplexer alone is large, it is difficult to obtain large attenuation in a duplexer module including the duplexer mounted on a circuit board. That is, when a duplexer is mounted on a circuit board, the attenuation of the duplexer is decreased, which is problematic.

In order to solve this problem, for example, Japanese Unexamined Patent Application Publication No. 2006-333168 describes a duplexer module shown in FIG. 53. As shown in FIG. 53, a duplexer module 100 includes a duplexer 102 mounted on a surface of a dielectric substrate 101. An independent ground terminal of a receiving side filter of the duplexer 102 is connected to one end of a chip inductor 103 mounted on a front surface of the dielectric substrate 101 by vias 104 and 105 and an interconnection line 106. The other end of the chip inductor 103 is connected to a back-surface ground electrode 108 provided on the back surface of the dielectric substrate 101 by a via 107.

Since the above-described chip inductor 103 is mounted in the duplexer module 100, the attenuation of a receiving side filter of the duplexer module 100 can be controlled by adjusting the inductance value of the chip inductor 103. For example, the attenuation of the receiving side filter of the duplexer module 100 can be increased. Accordingly, the isolation characteristic of the duplexer module 100 can be increased.

In order to achieve a high isolation characteristic of a duplexer module including a balanced duplexer including a pair of balanced terminals, the differential isolation and the differential attenuation must be increased. For example, if a receiving side filter includes first and second balanced signal terminals and is arranged to perform a balanced-unbalanced conversion function, the differential isolation determined by a characteristic between a transmitting side signal terminal and each of the first and second balanced signal terminals in the receiving frequency range and the differential attenuation determined by a characteristic between an antenna terminal and each of the first and second balanced signal terminals in the transmitting frequency range must be increased. However, the duplexer module described in Japanese Unexamined Patent Application Publication No. 2006-333168 cannot increase the differential isolation and the differential attenuation.

SUMMARY OF THE INVENTION

To overcome the problems described above, preferred embodiments of the present invention provide a high-frequency module that includes a balanced demultiplexer including a pair of balanced signal terminals and that has at least one of high differential isolation and high differential attenuation.

According to a preferred embodiment of the present invention, a high-frequency module preferably includes a circuit board and a demultiplexer mounted on the circuit board. The demultiplexer preferably includes an antenna terminal, a transmitting side signal terminal, first and second balanced signal terminals that define a receiving side signal terminal, a transmitting side filter, and a receiving side filter arranged to perform a balanced-unbalanced conversion function. The transmitting side filter is connected between the antenna terminal and the transmitting side signal terminal. The receiving side filter is connected between the antenna terminal and each of the first and second balanced signal terminals. The circuit board includes a first principal surface on which the demultiplexer is mounted and a second principal surface that faces the first principal surface. The first principal surface preferably includes a first front surface side electrode pad to which the antenna terminal is connected, a second front surface side electrode pad to which the transmitting side signal terminal is connected, a third front surface side electrode pad to which the first balanced signal terminal is connected, and a fourth front surface side electrode pad to which the second balanced signal terminal is connected provided thereon. The second principal surface preferably includes a first back surface side electrode pad connected to the first front surface side electrode pad, a second back surface side electrode pad connected to the second front surface side electrode pad, a third back surface side electrode pad connected to the third front surface side electrode pad, and a fourth back surface side electrode pad connected to the fourth front surface side electrode pad provided thereon. A distance between one of the antenna terminal and the transmitting side signal terminal and the first balanced signal terminal is preferably greater than a distance between one of the antenna terminal and transmitting side signal terminal and the second balanced signal terminal. A distance between one of the first and second back surface side electrode pads and the third back surface side electrode pad is preferably less than a distance between one of the first and second back surface side electrode pads and the fourth back surface side electrode pad.

According to a preferred embodiment of the present invention, the distance between the antenna terminal and the first balanced signal terminal is preferably greater than the distance between the antenna terminal and the second balanced signal terminal, and the distance between the first back surface side electrode pad and the third back surface side electrode pad is preferably less than the distance between the first back surface side electrode pad and the fourth back surface side electrode pad, the distance between the transmitting side signal terminal and the first balanced signal terminal is preferably greater than the distance between the transmitting side signal terminal and the second balanced signal terminal, and the distance between the second back surface side electrode pad and the third back surface side electrode pad is preferably less than the distance between the second back surface side electrode pad and the fourth back surface side electrode pad. In such a structure, the differential attenuation, which is a transmission characteristic from the antenna terminal to the balanced signal terminal in the transmitting frequency range, is increased. In addition, the differential isolation, which is a transmission characteristic from the transmitting side signal terminal to the balanced signal terminal in the receiving frequency range, is increased.

According to another preferred embodiment of the present invention, the distance between the antenna terminal and the first balanced signal terminal is preferably greater than the distance between the antenna terminal and the second balanced signal terminal, the distance between the first back surface side electrode pad and the third back surface side electrode pad is preferably less than the distance between the first back surface side electrode pad and the fourth back surface side electrode pad, the distance between the transmitting side signal terminal and the first balanced signal terminal is preferably less than the distance between the transmitting side signal terminal and the second balanced signal terminal, and the distance between the second back surface side electrode pad and the third back surface side electrode pad is preferably less than the distance between the second back surface side electrode pad and the fourth back surface side electrode pad. In such a structure, the differential attenuation in the transmitting frequency range and the differential isolation at the receiving frequency are increased.

According to another preferred embodiment of the present invention, in the high-frequency module, the distance between the transmitting side signal terminal and the first balanced signal terminal is preferably greater than the distance between the transmitting side signal terminal and the second balanced signal terminal, and the distance between the second back surface side electrode pad and the third back surface side electrode pad is preferably less than the distance between the second back surface side electrode pad and the fourth back surface side electrode pad.

According to still another preferred embodiment of the present invention, the high-frequency module further preferably includes a first interconnection line that connects the third front surface side electrode pad to the third back surface side electrode pad and a second interconnection line that connects the fourth front surface side electrode pad to the fourth back surface side electrode pad. Preferably, the first interconnection line intersects with the second interconnection line and the first interconnection line and the second interconnection line are insulated from each other.

According to another preferred embodiment of the present invention, the demultiplexer is preferably a triplexer that further includes a second transmitting side signal terminal and a second transmitting side filter disposed between the antenna terminal and the second transmitting side signal terminal.

According to still another preferred embodiment of the present invention, the demultiplexer is preferably a multiband duplexer including a plurality of duplexers, each including the antenna terminal, the transmitting side signal terminal, the transmitting side signal terminal, the first and second balanced terminals, the transmitting side filter, and the receiving side filter.

According to another preferred embodiment of the present invention, the demultiplexer preferably further includes a high-frequency switch connected between the antenna terminal and each of the transmitting side filter and the receiving side filter.

According to another preferred embodiment of the present invention, the high-frequency module preferably further includes a power amplifier connected to the transmitting side signal terminal.

According to another preferred embodiment of the present invention, the high-frequency module preferably further includes a matching circuit connected between the first and second balanced signal terminals and a matching circuit connected between the first and second interconnection lines.

According to another preferred embodiment of the present invention, the high-frequency module preferably further includes a matching circuit connected between a point of the first interconnection line on the side of the third back surface side electrode pad from an intersection of the first interconnection line and the second interconnection line and a point of the second interconnection line on the side of the fourth front surface side electrode pad from the intersection of the second interconnection line and the first interconnection line.

In a high-frequency module according to various preferred embodiments of the present invention, the distance between one of the antenna terminal and the transmitting side signal terminal and the first balanced signal terminal is preferably greater than a distance between one of the antenna terminal and transmitting side signal terminal and the second balanced signal terminal. In addition, the distance between one of the first and second back surface side electrode pads and the third back surface side electrode pad is preferably less than a distance between one of the first and second back surface side electrode pads and the fourth back surface side electrode pad. Accordingly, a difference in attenuation between the first and second balanced signal terminals with respect to the antenna terminal or the transmitting side signal terminal in the transmitting frequency range is reduced. Thus, the differential attenuation in the transmitting frequency range is increased. Alternatively, the difference between the isolation between the transmitting side signal terminal and the first balanced signal terminal and the isolation between the transmitting side signal terminal and the second balanced signal terminal is reduced. Thus, the differential isolation in the receiving frequency range is increased.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 53 is a perspective view illustrating the structure of a conventional duplexer module.

DETAILED DESCRIPTION OF THE PREFERRED EMBODIMENTS

Preferred embodiments of the present invention are described below with reference to the accompanying drawings.

First Preferred Embodiment

Figure 1:
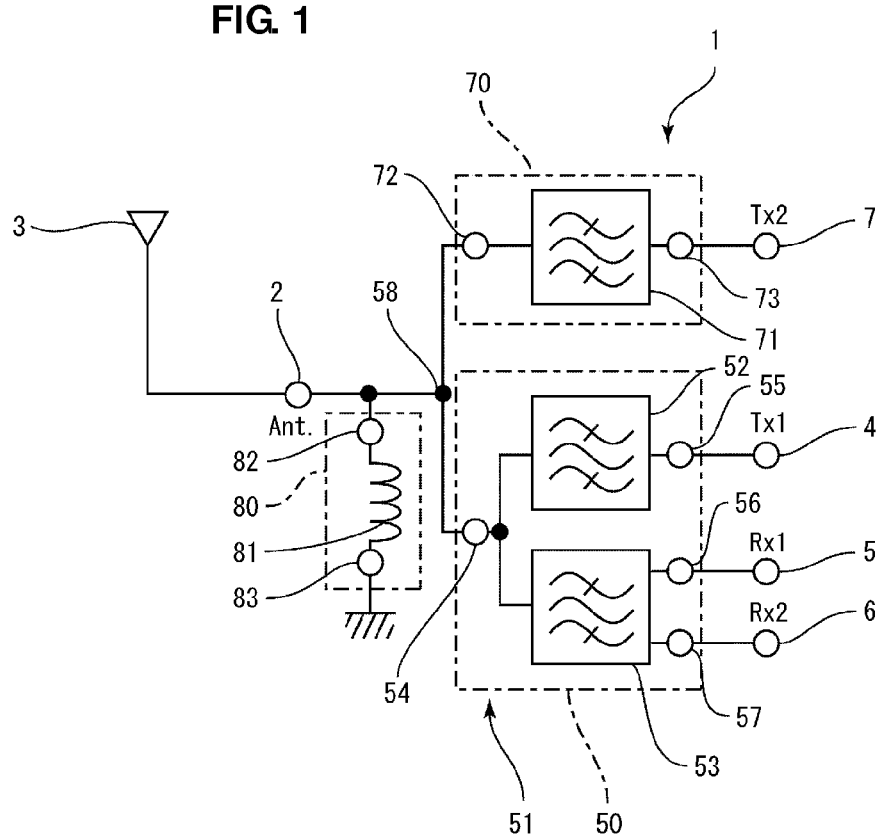
FIG. 1 is a schematic equivalent circuit diagram of a triplexer module according to a first preferred embodiment of the present invention.
Figure 2:
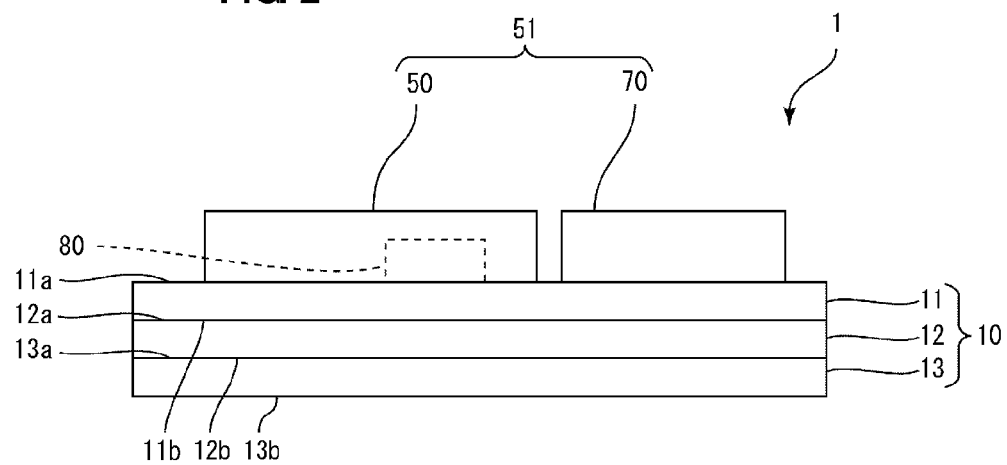
FIG. 2 is a schematic side view of the triplexer according to the first preferred embodiment of the present invention.

In the first preferred embodiment of the present invention, as an example of a high-frequency module, a triplexer module including a triplexer that functions as a demultiplexer is described. FIG. 1 is a schematic equivalent circuit diagram of a triplexer module according to the first preferred embodiment of the present invention. FIG. 2 is a schematic side view of the triplexer according to the first preferred embodiment.

As shown in FIG. 2, a triplexer module 1 preferably includes a circuit board 10, a duplexer chip 50 mounted on the circuit board 10, a transmitting side filter chip 70, and an inductor chip 80 including and a matching circuit provided therein. The transmitting frequency (Tx) of the duplexer chip 50 preferably ranges from about 1.92 GHz to about 1.98 GHz, for example. The receiving frequency (Rx) preferably ranges from about 2.11 GHz to about 2.17 GHz, for example. The transmitting frequency (Tx) of the transmitting side filter chip 70 preferably ranges from about 1.710 GHz to about 1.755 GHz, for example. The duplexer chip 50 and the transmitting side filter chip 70 define a triplexer chip 51 that supports UMTS-Band1 (Tx: 1.92 to 1.98 GHz, Rx: 2.11 to 2.17 GHz) and UMTS-Band4 (Tx: 1.710 to 1.755 GHz, Rx: 2.11 to 2.17 GHz). It should be noted that the configurations of the duplexer chip 50 and the transmitting side filter chip 70 are not limited to any particular configuration. For example, the duplexer chip 50 and the transmitting side filter chip 70 may have a configuration using elastic waves, such as a configuration using surface acoustic waves or boundary elastic waves.

As shown in FIG. 1, in the duplexer chip 50, a transmitting side filter 52 and a balanced receiving side filter 53 arranged to perform a balanced-unbalanced conversion function are preferably provided. The transmitting side filter 52 is connected between an antenna terminal 54 and a first transmitting side signal terminal 55. In contrast, the balanced receiving side filter 53 is connected between the antenna terminal 54 and each of a first balanced signal terminal 56 and a second balanced signal terminal 57.

The transmitting side filter chip 70 preferably includes a transmitting side filter 71 provided therein. The transmitting side filter 71 is connected between an antenna terminal 72 and a second transmitting side signal terminal 73. The antenna terminal 72 of the transmitting side filter chip 70 and the antenna terminal 54 of the duplexer chip 50 are commonly connected to an antenna terminal 2 of the triplexer module 1. The antenna terminal 2 is connected to an antenna 3.

It should be noted that the circuit configurations of the transmitting side filters 52 and 71 are not limited to any particular circuit configuration. However, for example, the transmitting side filters 52 and 71 maybe be defined by a ladder filter that has a high power resistance. In addition, the circuit configuration of the receiving side filter 53 is not limited to any particular circuit configuration. However, for example, the receiving side filter 53 may be defined by a longitudinally coupled resonator type elastic wave filter.

The inductor chip 80 preferably includes an inductor 81 provided therein. The inductor 81 preferably functions as a matching circuit. One end of the inductor 81 is connected to a first terminal 82, and the other end is connected to a second terminal 83. The first terminal 82 is connected to a point between a connection point of the antenna terminal 72 of the transmitting side filter chip 70 and the antenna terminal 54 of the duplexer chip 50 and the antenna terminal 2. The second terminal 83 is connected to the ground potential.

A mounting structure of the duplexer chip 50, the transmitting side filter chip 70, and the inductor chip 80 is described next.

As shown in FIG. 2, according to the first preferred embodiment, the circuit board 10 preferably includes three substrate layers 11, 12, and 13 that are sintered into one body using a ceramic co-firing technology, for example. A first principal surface of the first substrate layer 11 defines a mounting surface 11a. A second principal surface 11b of the first substrate layer 11 faces a first principal surface 12a of the second substrate layer 12. A second principal surface 12b of the second substrate layer 12 faces a first principal surface 13a of the third substrate layer 13. A second principal surface of the third substrate layer 13 serves as a back surface 13b. The duplexer chip 50, the transmitting side filter chip 70, and the inductor chip 80 are mounted on the mounting surface 11a of the first substrate layer 11.

Figure 3:
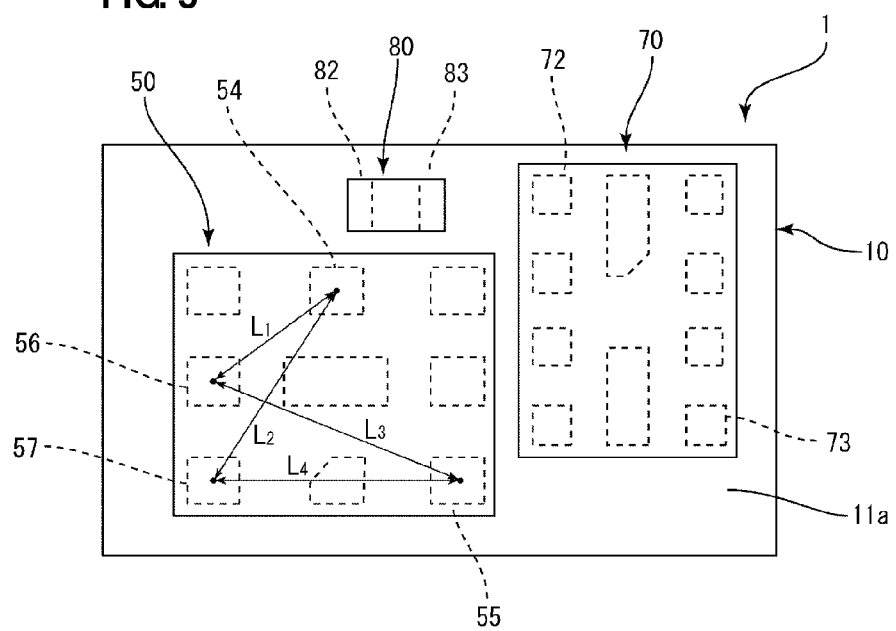
FIG. 3 is a plan view of the triplexer module according to the first preferred embodiment of the present invention.
Figure 4:
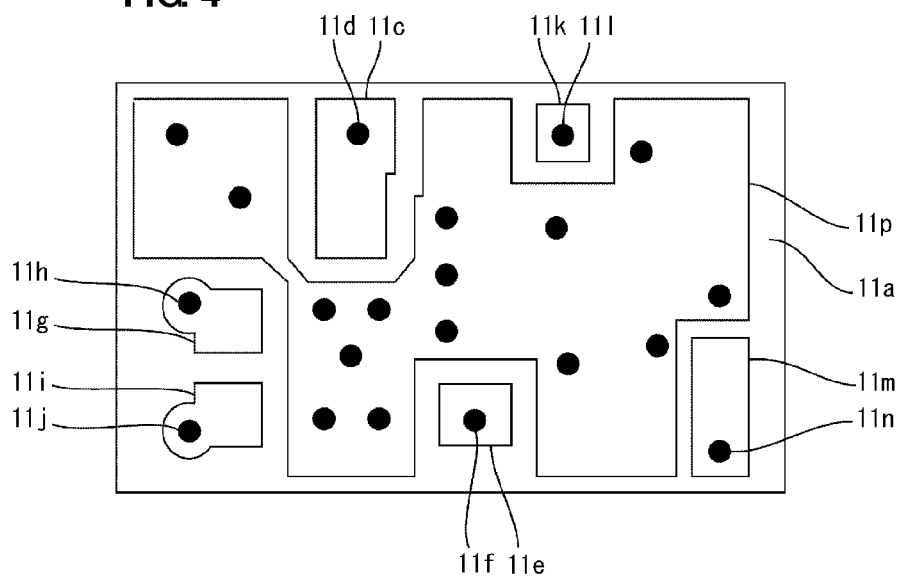
FIG. 4 is a plan view of a mounting surface of the first substrate according to the first preferred embodiment of the present invention.
Figure 5:
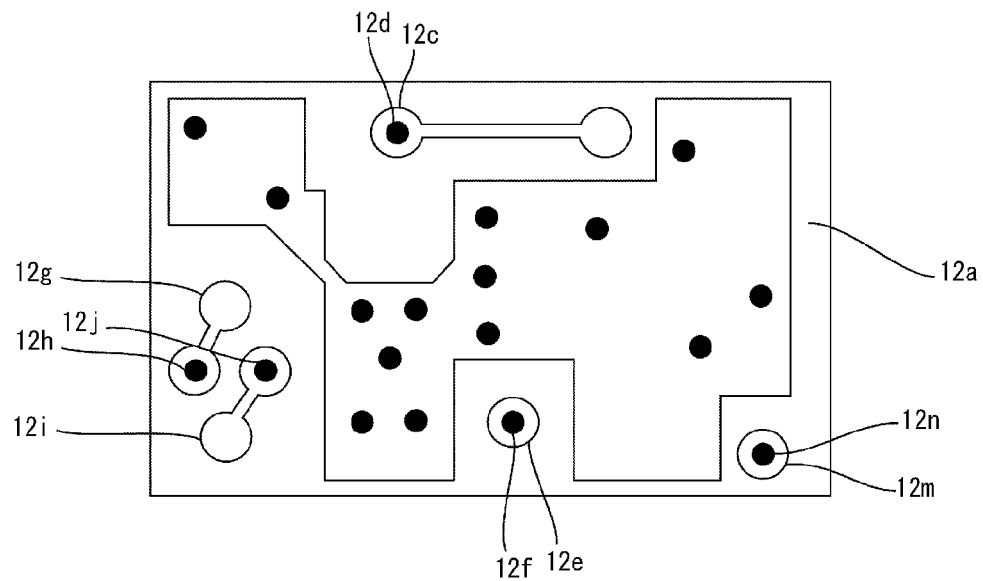
FIG. 5 is a plan view of the first principal surface of a second substrate according to the first preferred embodiment of the present invention.
Figure 6:
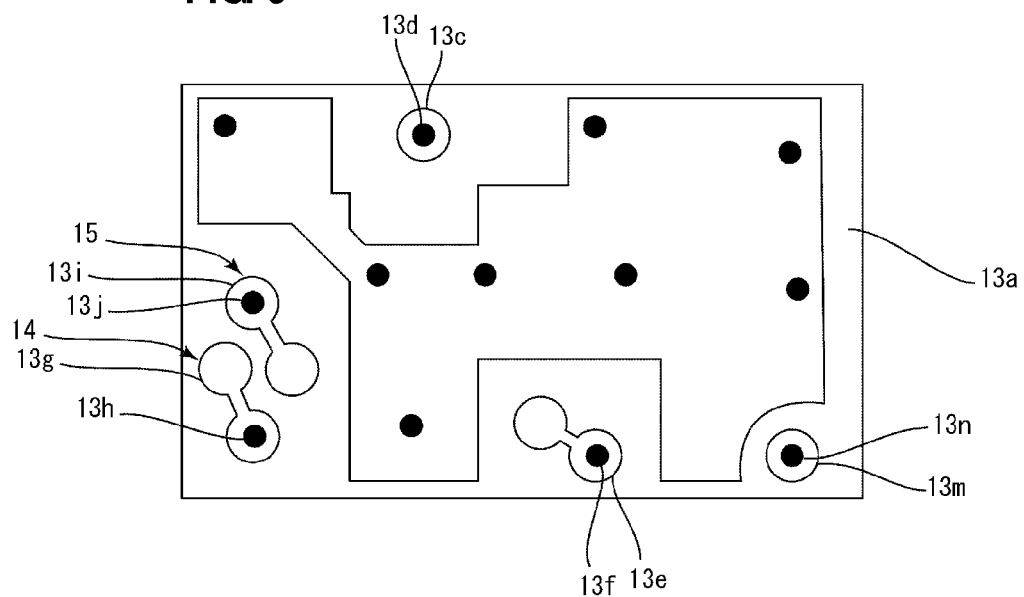
FIG. 6 is a plan view of the first principal surface of a third substrate according to the first preferred embodiment of the present invention.
Figure 7:
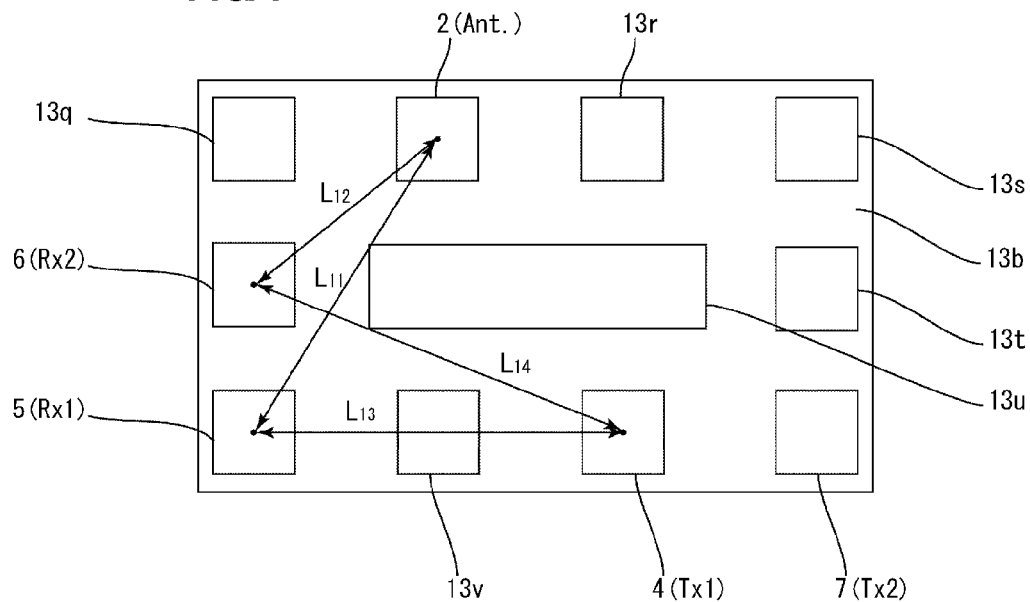
FIG. 7 is a bottom view of the triplexer module according to the first preferred embodiment of the present invention.

FIG. 3 is a plan view of the triplexer module 1. FIG. 4 is a plan view of the mounting surface 11a of the first substrate layer 11. FIG. 5 is a plan view of the first principal surface 12a of the second substrate layer 12. FIG. 6 is a plan view of the first principal surface 13a of the third substrate layer 13. FIG. 7 is a bottom view of the triplexer module 1 when perspectively viewed from the side of the first principal surface 13a of the third substrate layer 13. Note that in FIGS. 4 to 7, a black circle "•" represents a via electrode. In addition, in FIG. 3, to simplify the description, electrodes formed on the mounting surface 11a are not shown.

As shown in FIG. 3, the antenna terminal 54 of the duplexer chip 50 is connected to an electrode 11c (refer to FIG. 4) defining a first front surface side electrode pad provided on the mounting surface 11a. The electrode 11c is connected to an electrode 12c (refer to FIG. 5) provided on the first principal surface 12a of the second substrate layer 12 by a via electrode 11d provided in the first substrate layer 11. The electrode 12c is connected to an electrode 13c (refer to FIG. 6) provided on the first principal surface 13a of the third substrate layer 13 by a via electrode 12d provided in the second substrate layer 12. The electrode 13c is connected to the antenna terminal 2 (refer to FIG. 7) defining a first back surface side electrode pad provided on the back surface 13b by a via electrode 13d provided in the third substrate layer 13. The antenna terminal 2 is arranged to be connected to the antenna 3 shown in FIG. 1.

The first transmitting side signal terminal 55 of the duplexer chip 50 shown in FIG. 3 is connected to an electrode 11e (refer to FIG. 4) defining a second front surface side electrode pad provided on the mounting surface 11a of the first substrate layer 11. The electrode 11e is connected to an electrode 12e (refer to FIG. 5) provided on the first principal surface 12a of the second substrate layer 12 by a via electrode 11f provided in the first substrate layer 11. The electrode 12e is connected to an electrode 13e (refer to FIG. 6) provided on the first principal surface 13a of the third substrate layer 13 by a via electrode 12f provided in the second substrate layer 12. The electrode 13e is connected to a first transmitting side signal terminal 4 (refer to FIG. 7) defining a second back surface side electrode pad provided on the back surface 13b by a via electrode 13f provided in the third substrate layer 13.

As shown in FIG. 3, the first balanced signal terminal of the duplexer chip 50 is connected to an electrode 11g (refer to FIG. 4) defining a third front surface side electrode pad provided on the mounting surface 11a of the first substrate layer 11. The electrode 11g is connected to an electrode 12g (refer to FIG. 5) provided on the first principal surface 12a of the second substrate layer 12 by a via electrode 11h provided in the first substrate layer 11. The electrode 12g is connected to an electrode 13g (refer to FIG. 6) provided on the first principal surface 13a of the third substrate layer 13 by a via electrode 12h provided in the second substrate layer 12. The electrode 13g is connected to a first balanced signal terminal 5 (refer to FIG. 7) defining a third back surface side electrode pad provided on the back surface 13b by a via electrode 13h provided in the third substrate layer 13. According to the first preferred embodiment, the via electrodes 11h, 12h, and 13h and the electrodes 12g and 13g define a first interconnection line 14.

As shown in FIG. 3, the second balanced signal terminal 57 of the duplexer chip 50 is connected to an electrode 11i (refer to FIG. 4) defining a fourth front surface side electrode pad provided on the mounting surface 11a of the first substrate layer 11. The electrode 11i is connected to an electrode 12i (refer to FIG. 5) provided on the first principal surface 12a of the second substrate layer 12 by a via electrode 11j provided in the first substrate layer 11. The electrode 12i is connected to an electrode 13i (refer to FIG. 6) provided on the first principal surface 13a of the third substrate layer 13 by a via electrode 12j provided in the second substrate layer 12. The electrode 13i is connected to a second balanced signal terminal 6 (refer to FIG. 7) defining a fourth back surface side electrode pad provided on the back surface 13b by a via electrode 13j provided in the third substrate layer 13. According to the first preferred embodiment, the via electrodes 11j, 12j, and 13j and the electrodes 12i and 13i define a second interconnection line 15.

As shown in FIG. 3, the antenna terminal 72 of the transmitting side filter chip 70 is connected to an electrode 11k (refer to FIG. 4) provided on the mounting surface 11a of the first substrate layer 11. The electrode 11k is connected to, by a via electrode 11l provided in the first substrate layer 11, the electrode 12c (refer to FIG. 5) that is provided on the first principal surface 12a of the second substrate layer 12 and that is connected to the antenna terminal 2 shown in FIG. 7 as described above.

As shown in FIG. 3, the second transmitting side signal terminal 73 of the transmitting side filter chip 70 is connected to an electrode 11m (refer to FIG. 4) provided on the mounting surface 11a of the first substrate layer 11. The electrode 11m is connected to an electrode 12m (refer to FIG. 5) provided on the first principal surface 12a of the second substrate layer 12 by a via electrode 11n provided in the first substrate layer 11. The electrode 12m is connected to an electrode 13m (refer to FIG. 6) provided on the first principal surface 13a of the third substrate layer 13 by a via electrode 12n provided in the second substrate layer 12. The electrode 13m is connected to a second transmitting side signal terminal 7 (refer to FIG. 7) provided on the back surface 13b by a via electrode 13n provided in the third substrate layer 13.

As shown in FIG. 3, the first terminal 82 of the inductor chip 80 is connected to the electrode 11c (refer to FIG. 4) connected to the antenna terminal 2 shown in FIG. 7 as described above. In contrast, the second terminal 83 is connected to a ground electrode 11p provided on the mounting surface 11a of the first substrate layer 11. The ground electrode 11p is connected to ground electrodes 13q to 13v shown in FIG. 7 by a plurality of via electrodes provided in the first to third substrate layers 11 to 13.

Note that, among the terminals indicated by dotted lines in FIG. 3, the terminals having no reference numerals are ground terminals. The ground terminals are connected to the ground electrodes 13q to 13v shown in FIG. 7.

According to the first preferred embodiment, as shown in FIGS. 5 and 6, the positional relationship between the electrodes 12g and 12i is preferably the reverse of that between the electrodes 13g and 13i. Accordingly, the first interconnection line 14 crosses the second interconnection line and the first interconnection line 14 and the second interconnection line 15 are insulated from each other. As a result, $L_1$ and $L_{11}$ denote a distance between the first balanced terminal and the antenna terminal on the mounting surface 11a and the back surface 13b, respectively, and $L_2$ and $L_{12}$ denote a distance between the second balanced terminal and the antenna terminal on the mounting surface 11a and the back surface 13b, respectively. Then, a relationship between the distances $L_1$ and $L_2$ is preferably the reverse of a relationship between the distances $L_{11}$ and $L_{12}$. More specifically, as shown in FIG. 3, on the mounting surface 11a, the distance $L_2$ between the antenna terminal 54 and the second balanced signal terminal 57 is preferably greater than the distance $L_1$ between the antenna terminal 54 and the first balanced signal terminal 56. In contrast, as shown in FIG. 7, on the back surface 13b, the distance $L_{12}$ between the antenna terminal 2 and the second balanced signal terminal 6 is preferably less than the distance $L_{11}$ between the antenna terminal 2 and the first balanced signal terminal 5.

Accordingly, on the mounting surface 11a, the first balanced signal terminal 56 is more strongly electromagnetically coupled with the antenna terminal 54 than the second balanced signal terminal 57 is. In contrast, on the back surface 13b, the second balanced signal terminal 6 is more strongly electromagnetically coupled with the antenna terminal 2 than the first balanced signal terminal 5 is. As a result, as a whole, a difference between the strength of electromagnetic coupling between the antenna terminal and the first balanced signal terminal and the strength of electromagnetic coupling between the antenna terminal and the second balanced signal terminal is reduced. Consequently, a difference between attenuation between the antenna terminal and the first balanced signal terminal in the transmitting frequency range and attenuation between the antenna terminal and the second balanced signal terminal in the transmitting frequency range is reduced. Therefore, the differential attenuation determined by a characteristic between the antenna terminal and the first balanced signal terminal and a characteristic between the antenna terminal and the second balanced signal terminal in the transmitting frequency range is increased.

In addition, according to the first preferred embodiment, $L_3$ and $L_{13}$ denote a distance between the first balanced terminal and the first transmitting side signal terminal on the mounting surface 11a and the back surface 13b, respectively, and $L_4$ and $L_{14}$ denote a distance between the second balanced terminal and the first transmitting side signal terminal on the mounting surface 11a and the back surface 13b, respectively. Then, a relationship between the distances $L_3$ and $L_4$ is preferably the reverse of a relationship between the distances $L_{13}$ and $L_{14}$. More specifically, as shown in FIG. 3, on the mounting surface 11a, the distance $L_3$ between the first transmitting side signal terminal 55 and the first balanced signal terminal 56 is preferably greater than the distance $L_4$ between the first transmitting side signal terminal 55 and the second balanced signal terminal 57. In contrast, as shown in FIG. 7, on the back surface 13b, the distance $L_{13}$ between the first transmitting side signal terminal 4 and the first balanced signal terminal 5 is preferably less than the distance $L_{14}$ between the first transmitting side signal terminal 4 and the second balanced signal terminal 6.

Accordingly, on the mounting surface 11a, the second balanced signal terminal 57 is more strongly electromagnetically coupled with the first transmitting side signal terminal 55 than the first balanced signal terminal 56 is. In contrast, on the back surface 13b, the first balanced signal terminal 5 is more strongly electromagnetically coupled with the first transmitting side signal terminal 4 than the second balanced signal terminal 6 is. As a result, as a whole, a difference between the strength of electromagnetic coupling between the first transmitting side signal terminal and the first balanced signal terminal and the strength of electromagnetic coupling between the first transmitting side signal terminal and the second balanced signal terminal is reduced. Consequently, a difference between the unbalanced isolation between the first transmitting side signal terminal and the first balanced signal terminal in the receiving frequency range and the unbalanced isolation between the first transmitting side signal terminal and the second balanced signal terminal in the receiving frequency range is reduced. Therefore, the differential isolation determined by a characteristic between the transmitting side signal terminal and the first balanced signal terminal and a characteristic between the transmitting side signal terminal and the second balanced signal terminal in the receiving frequency range is increased.

In particular, according to the first preferred embodiment, when $L_1$ and $L_{11}$ denote the distances on the mounting surface 11a and the back surface 13b, respectively, and $L_2$ and $L_{12}$ denote the distances on the mounting surface 11a and the back surface 13b, respectively, a relationship between the distances $L_1$ and $L_2$ is the reverse of a relationship between the distances $L_{11}$ and $L_{12}$. In addition, when $L_3$ and $L_{13}$ denote the distances on the mounting surface 11a and the back surface 13b, respectively, and $L_4$ and $L_{14}$ denote the distances on the mounting surface 11a and the back surface 13b, respectively, a relationship between the distances $L_3$ and $L_4$ is the reverse of a relationship between the distances $L_{13}$ and $L_{14}$. Accordingly, the differential attenuation determined by a characteristic between the antenna terminal and the first balanced signal terminal and a characteristic between the antenna terminal and the second balanced signal terminal in the transmitting frequency range is increased. At the same time, the differential isolation determined by a characteristic between the transmitting side signal terminal and the first balanced signal terminal and a characteristic between the transmitting side signal terminal and the second balanced signal terminal in the receiving frequency range is increased.

Note that the above-described differential attenuation and differential isolation are defined using S parameters as follows:

$$Sdd31=(S31-S41)/\{(2)^{1/2}\}, \text{ and}$$

$$Sdd32=(S32-S42)/\{(2)^{1/2}\},$$

where

Sdd1: differential attenuation,

Sdd2: differential isolation,

S31: the S parameter from the antenna terminal (Ant) to the first balanced signal terminal (Rx1), S41: the S parameter from the antenna terminal (Ant) to the second balanced signal terminal (Rx2), S32: the S parameter from the transmitting side signal terminal (Tx) to the first balanced signal terminal (Rx1), and S42: the S parameter from the transmitting side signal terminal (Tx) to the second balanced signal terminal (Rx2).

The advantage in which the differential isolation and the differential attenuation are increased is described with reference to an example of an experiment.

As a comparative example for the triplexer module 1 according to the first preferred embodiment, a triplexer module 1a is produced. Only the structures of the first interconnection line 14 and the second interconnection line 15 and the arrangement of the first and second balanced signal terminals 56 and 57 on the mounting surface 11a of the triplexer module 1a are changed from those of the triplexer module 1. The triplexer module of the comparative example and the triplexer module 1 according to the first preferred embodiment have substantially the same arrangement of the first and second balanced signal terminals 5 and 6 on the back surface 13b.

A plan view of the triplexer module of the comparative example, a plan view of the mounting surface of the first substrate layer, a plan view of the first principal surface of the second substrate layer, a plan view of the first principal surface of the third substrate layer, and the back surface of the third substrate layer are shown in FIGS. 8 to 12, respectively. Note that components of the triplexer of the comparative example having functions that are substantially the same as those of the first preferred embodiment are denoted by the same reference numerals as those used for corresponding components of the first preferred embodiment, and the descriptions thereof are not repeated.

Figure 8:
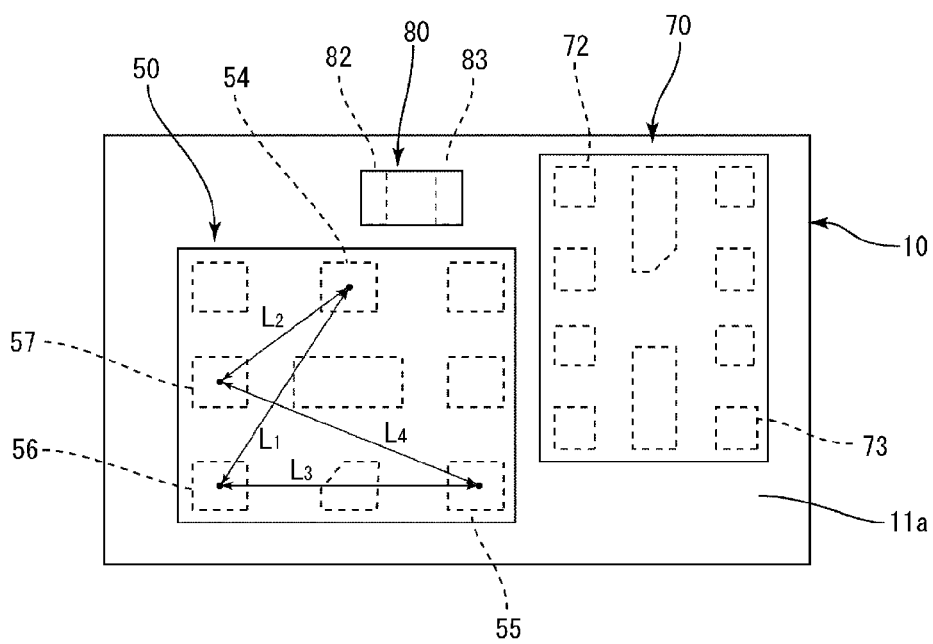
FIG. 8 is a plan view of a triplexer module of a comparative example.
Figure 9:
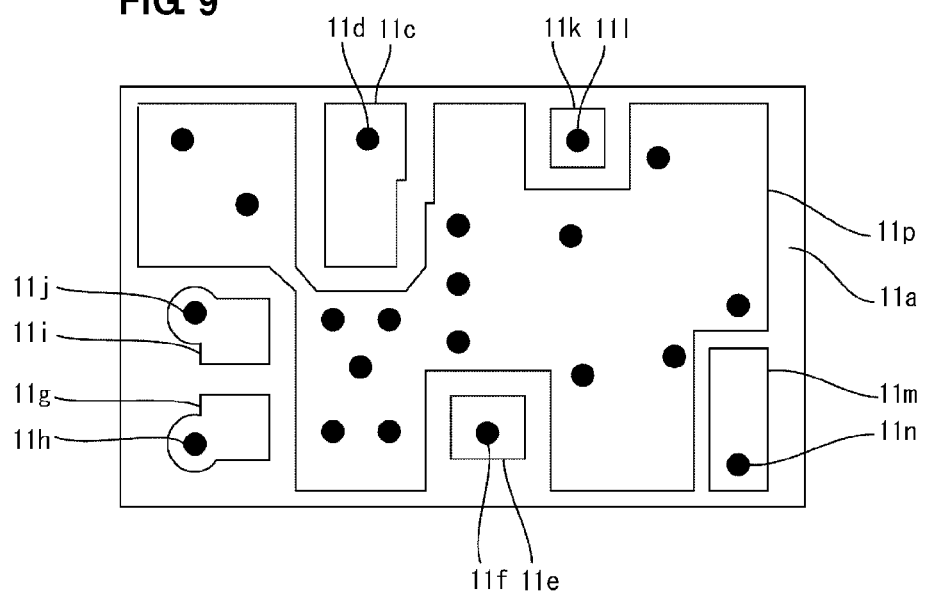
FIG. 9 is a plan view of a mounting surface of a first substrate of the comparative example.
Figure 10:
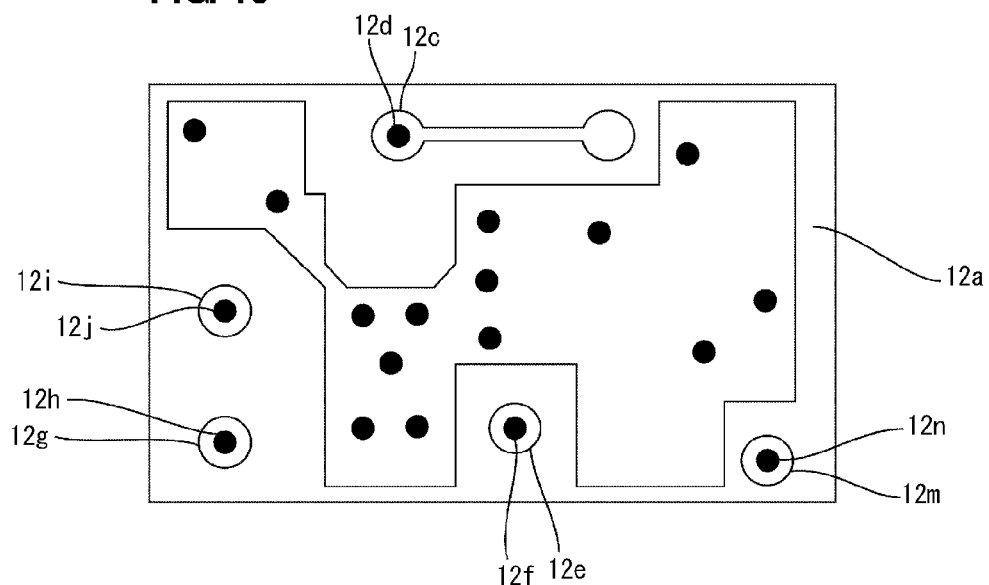
FIG. 10 is a plan view of the first principal surface of a second substrate of the comparative example.
Figure 11:
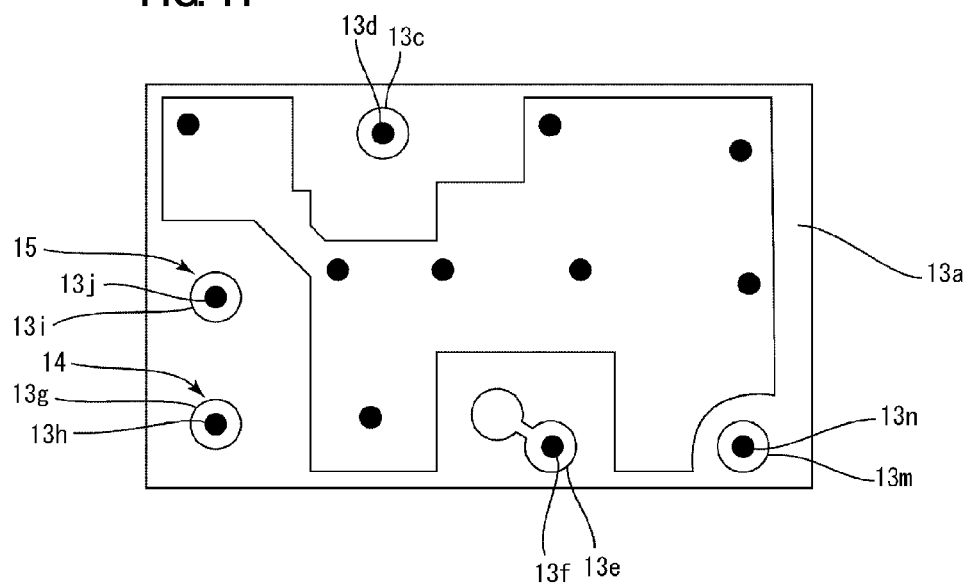
FIG. 11 is a plan view of the first principal surface of a third substrate of the comparative example.
Figure 12:
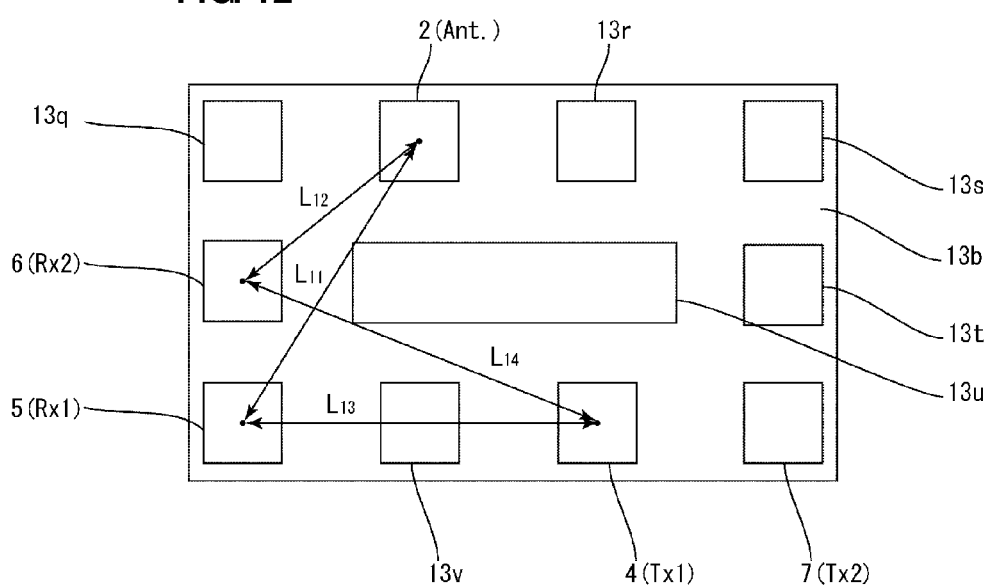
FIG. 12 is a bottom view of the triplexer module of the comparative example.

As shown in FIGS. 10 and 11, in the comparative example, the positional relationship between the electrodes 12g and 12i is not the reverse of the positional relationship between the electrodes 13g and 13i. Thus, the first interconnection line 14 does not intersect with the second interconnection line 15. Instead, the first interconnection line is parallel or substantially parallel to the second interconnection line 15. Accordingly, the positional relationship between the first balanced signal terminal 56 and the second balanced signal terminal 57 on the mounting surface 11a is the same as the positional relationship between the first balanced signal terminal 5 and the second balanced signal terminal 6 on the back surface 13b. As a result, the relationship between the distances $L_1$ between the first balanced signal terminal and the antenna terminal and the distance $L_2$ between the second balanced signal terminal and the antenna terminal on the mounting surface 11a is the same as the relationship between the distances $L_{11}$ between the first balanced signal terminal and the antenna terminal and the distance $L_{12}$ between the second balanced signal terminal and the antenna terminal on the back surface 13b. More specifically, as shown in FIGS. 8 and 12, on the mounting surface 11a, the distance $L_1$ between the antenna terminal and the first balanced signal terminal is greater than the distance $L_2$ between the antenna terminal and the second balanced signal terminal. Similarly, on the back surface 13b, the distance $L_{11}$ between the antenna terminal and the first balanced signal terminal is greater than the distance $L_{12}$ between the antenna terminal and the second balanced signal terminal.

Furthermore, the relationship between the distances $L_3$ between the first balanced signal terminal and the first transmitting side signal terminal and the distance $L_4$ between the second balanced signal terminal and the first transmitting side signal terminal on the mounting surface 11a is the same as the relationship between the distances $L_{13}$ between the first balanced signal terminal and the first transmitting side signal terminal and the distance $L_{14}$ between the second balanced signal terminal and the first transmitting side signal terminal on the back surface 13b. More specifically, on the mounting surface 11a, the distance $L_4$ between the first transmitting side signal terminal and the second balanced signal terminal is greater than and the distances $L_3$ between the first transmitting side signal terminal and the first balanced signal terminal. Similarly, on the back surface 13b, the distance $L_{14}$ between the first transmitting side signal terminal and the second balanced signal terminal is greater than the distances $L_{13}$ between the first transmitting side signal terminal and the first balanced signal terminal.

Figure 13:
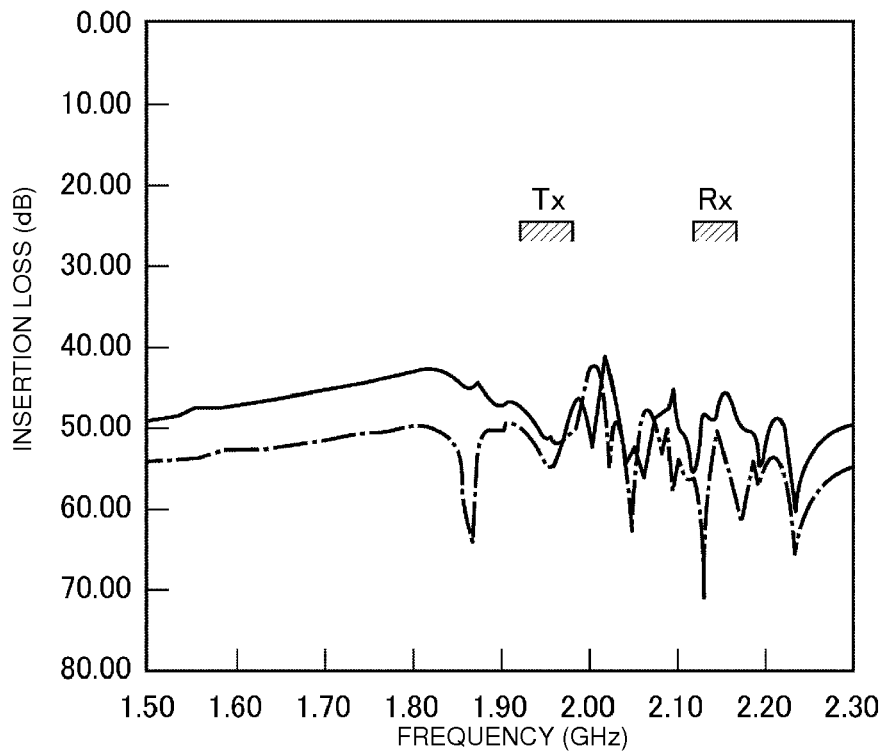
FIG. 13 is a graph illustrating the unbalanced isolation between a transmitting side signal terminal and a first balanced signal terminal and the unbalanced isolation between the transmitting side signal terminal and a second balanced signal terminal in a duplexer chip alone, where a solid line represents the unbalanced isolation between the transmitting side signal terminal and the first balanced signal terminal, and an alternate long and short dash line represents the unbalanced isolation between the transmitting side signal terminal and the second balanced signal terminal.

The unbalanced isolation characteristic of the duplexer chip 50 alone is described first with reference to FIG. 13. Note that in FIG. 13, the unbalanced isolation between the transmitting side signal terminal and the first balanced signal terminal of the duplexer chip 50 is represented by a solid line, and the unbalanced isolation between the transmitting side signal terminal and the second balanced signal terminal of the duplexer chip 50 is represented by an alternate long and short dash line.

From FIG. 13, it can be seen that, in the duplexer chip 50 alone, the unbalanced isolation between the transmitting side signal terminal and the first balanced signal terminal differs from the unbalanced isolation between the transmitting side signal terminal and the second balanced signal terminal.

More specifically, at a frequency of about 1.95 GHz, the unbalanced isolation between the transmitting side signal terminal and the first balanced signal terminal was about 51.0 dB. In contrast, the unbalanced isolation between the transmitting side signal terminal and the second balanced signal terminal was about 54.8 dB. Thus, the difference is about 3.8 dB. This is because the distances $L_3$ between the transmitting side signal terminal 55 and the first balanced signal terminal 56 differs from the distance $L_4$ between the transmitting side signal terminal 55 and the second balanced signal terminal 57.

Figure 14:
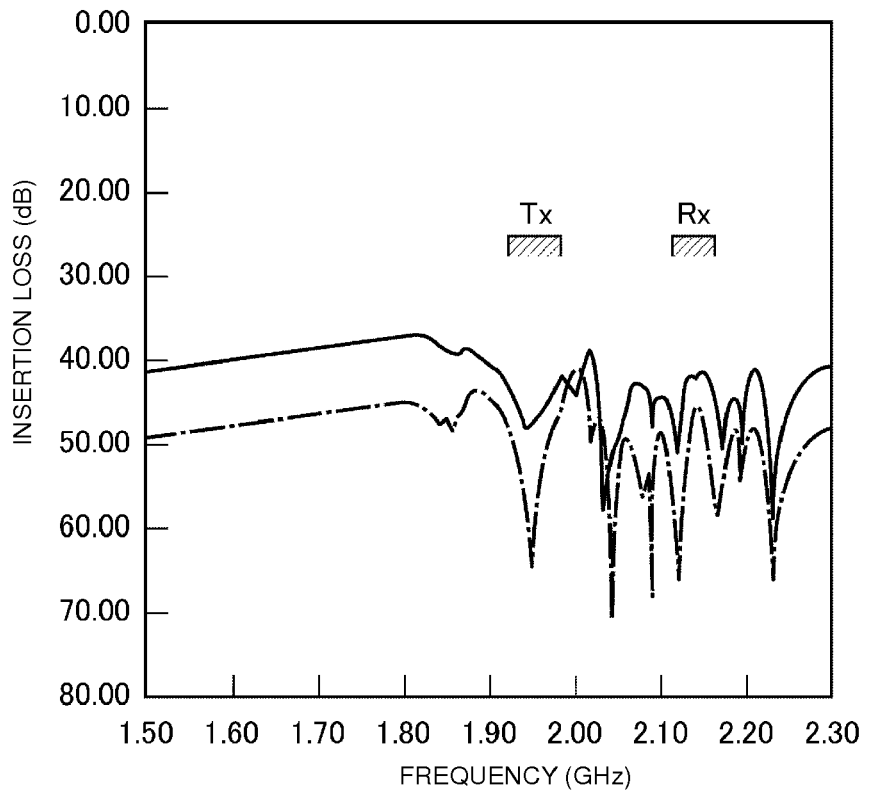
FIG. 14 is a graph illustrating the unbalanced isolation between a transmitting side signal terminal and a first balanced signal terminal and the unbalanced isolation between the transmitting side signal terminal and a second balanced signal terminal in a high-frequency module of the comparative example, where a solid line represents the unbalanced isolation between the transmitting side signal terminal and the first balanced signal terminal, and an alternate long and short dash line represents the unbalanced isolation between the transmitting side signal terminal and the second balanced signal terminal.

FIG. 14 is a graph illustrating the unbalanced isolation of the high-frequency module of the comparative example. In FIG. 14, the unbalanced isolation between the transmitting side signal terminal and the first balanced signal terminal is represented by a solid line, and the unbalanced isolation between the transmitting side signal terminal and the second balanced signal terminal is represented by an alternate long and short dash line. From a comparison of FIGS. 13 and 14, in the comparative example, the difference between the unbalanced isolations in the receiving frequency range of the high-frequency module is greater than the difference between the unbalanced isolations in the receiving frequency range of the duplexer chip 50 alone. That is, by mounting the duplexer chip 50 on the circuit board 10, a difference between the unbalanced isolation between the transmitting side signal terminal and the first balanced signal terminal and the unbalanced isolation between the transmitting side signal terminal and the second balanced signal terminal is increased in the receiving frequency range.

More specifically, as illustrated in TABLE 1 below, in the high-frequency module of the comparative example, at a frequency of about 1.95 GHz, the unbalanced isolation between the transmitting side signal terminal and the first balanced signal terminal was about 46.5 dB. In contrast, the unbalanced isolation between the transmitting side signal terminal and the second balanced signal terminal was about 60.4 dB. By mounting the duplexer chip 50 on the circuit board 10, the unbalanced isolation between the transmitting side signal terminal and the first balanced signal terminal was degraded by about 4.5 dB at a frequency of about 1.95 GHz. However, the unbalanced isolation between the transmitting side signal terminal and the second balanced signal terminal was improved by about 5.6 dB. As a result, in the receiving frequency range, the difference between the unbalanced isolation between the transmitting side signal terminal and the first balanced signal terminal and the unbalanced isolation between the transmitting side signal terminal and the second balanced signal terminal is increased from about 3.8 dB to about 13.9 dB.

This is because, in the comparative example, the positional relationship between the first and second balanced signal terminals with respect to the transmitting side signal terminal in the duplexer chip 50 is the same as that on the back surface 13b. That is, in the comparative example, the relationship between the distances $L_3$ and $L_4$ in the duplexer chip 50 is the same as the relationship between the distances $L_{13}$ and $L_{14}$ on the back surface 13b.

Figure 15:
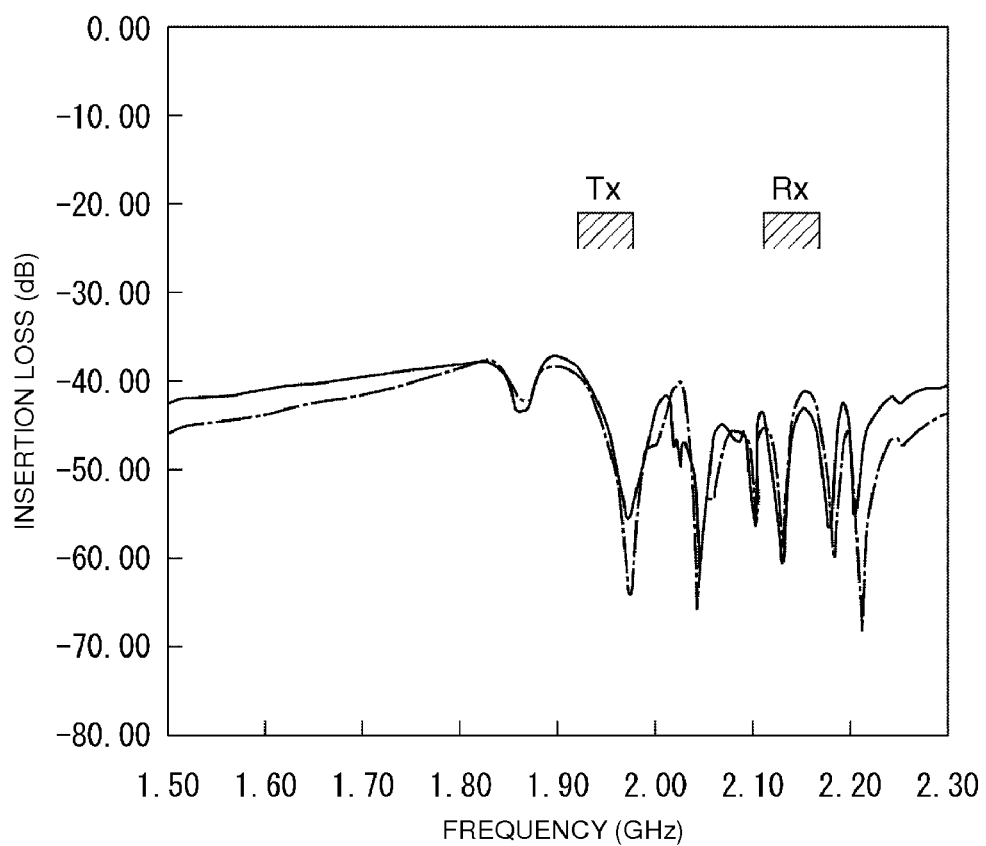
FIG. 15 is a graph illustrating the unbalanced isolation between a transmitting side signal terminal and a first balanced signal terminal and the unbalanced isolation between the transmitting side signal terminal and a second balanced signal terminal in a high-frequency module of the first preferred embodiment of the present invention, where a solid line represents the unbalanced isolation between the transmitting side signal terminal and the first balanced signal terminal, and an alternate long and short dash line represents the unbalanced isolation between the transmitting side signal terminal and the second balanced signal terminal.

FIG. 15 is a graph illustrating the unbalanced isolation of the high-frequency module according to the first preferred embodiment. In FIG. 15, the unbalanced isolation between the transmitting side signal terminal and the first balanced signal terminal is represented by a solid line, and the unbalanced isolation between the transmitting side signal terminal and the second balanced signal terminal is represented by an alternate long and short dash line. In the comparative example, the relationship between the distances $L_3$ and $L_4$ in the duplexer chip 50 is the same as the relationship between the distances $L_{13}$ and $L_{14}$ on the back surface 13b. However, according to the first preferred embodiment, the relationship between the distances $L_3$ and $L_4$ in the duplexer chip 50 is the reverse of the relationship between the distances $L_{13}$ and $L_{14}$ on the back surface 13b. Accordingly, as can be seen from the comparison of FIGS. 13 and 15, in the first preferred embodiment, the difference between the unbalanced isolation between the transmitting side signal terminal and the first balanced signal terminal and the unbalanced isolation between the transmitting side signal terminal and the second balanced signal terminal in the receiving frequency range is less than that in the duplexer chip 50 alone.

More specifically, as illustrated in TABLE 2 below, in the high-frequency module of the first preferred embodiment, at a frequency of about 1.95 GHz, the unbalanced isolation between the transmitting side signal terminal and the first balanced signal terminal was about 46.3 dB. In contrast, the unbalanced isolation between the transmitting side signal terminal and the second balanced signal terminal was about 45.8 dB. By mounting the duplexer chip 50 on the circuit board 10, the unbalanced isolation between the transmitting side signal terminal and the first balanced signal terminal was degraded by about 4.7 dB at a frequency of about 1.95 GHz. In contrast, the unbalanced isolation between the transmitting side signal terminal and the second balanced signal terminal was degraded by about 9.0 dB. As a result, at a frequency of about 1.95 GHz, the difference between the unbalanced isolation between the transmitting side signal terminal and the first balanced signal terminal and the unbalanced isolation between the transmitting side signal terminal and the second balanced signal terminal is significantly decreased from about 3.8 dB to about 0.5 dB.

Figure 16:
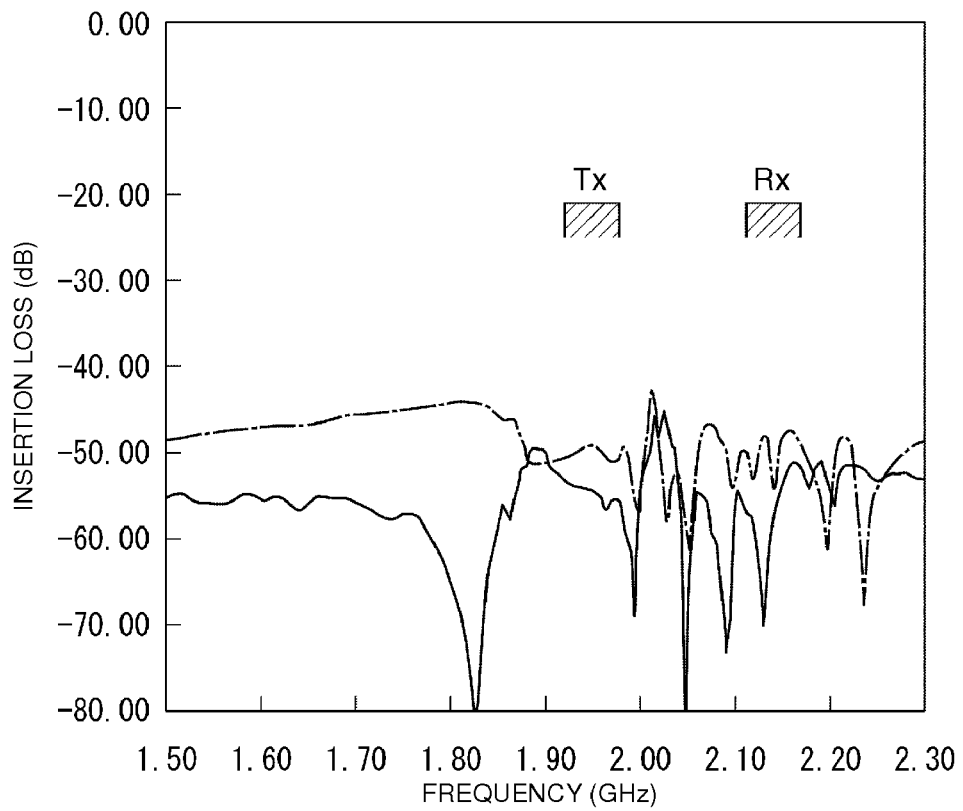
FIG. 16 is a graph illustrating the differential isolation in the high-frequency modules of the first preferred embodiment of the present invention and the comparative example, where a solid line represents the differential isolation in the high-frequency module of the first preferred embodiment of the present invention, and an alternate long and short dash line represents the differential isolation in the high-frequency module of the comparative example.
Figure 17:
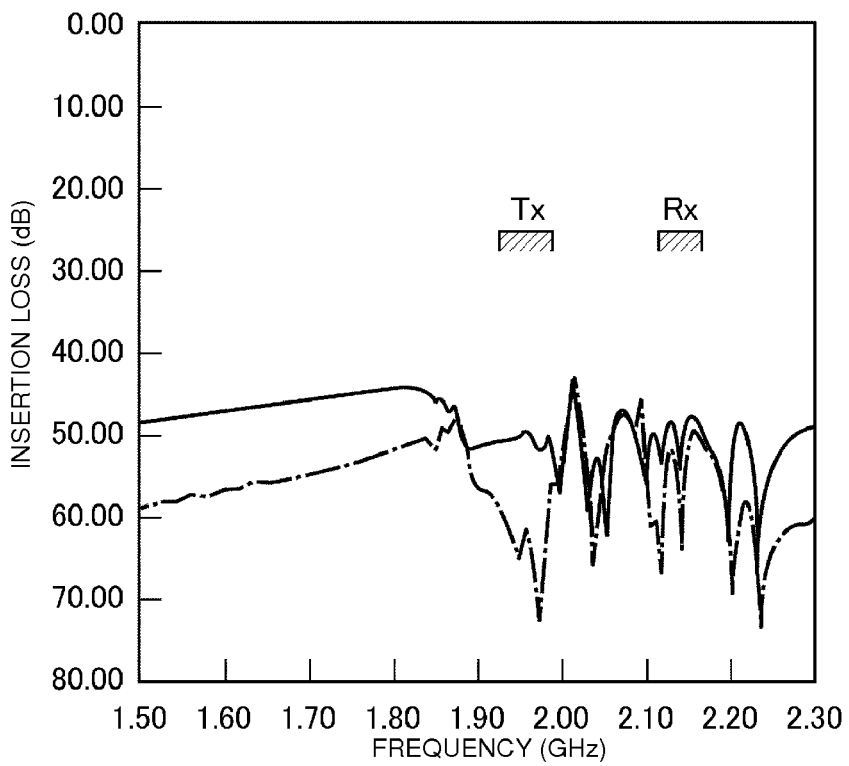
FIG. 17 is a graph illustrating the differential isolation in the duplexer chip and the differential isolation in the high-frequency module of the comparative example, where a solid line represents the differential isolation in the high-frequency module of the comparative example, and an alternate long and short dash line represents the differential isolation in the duplexer chip.
Figure 18:
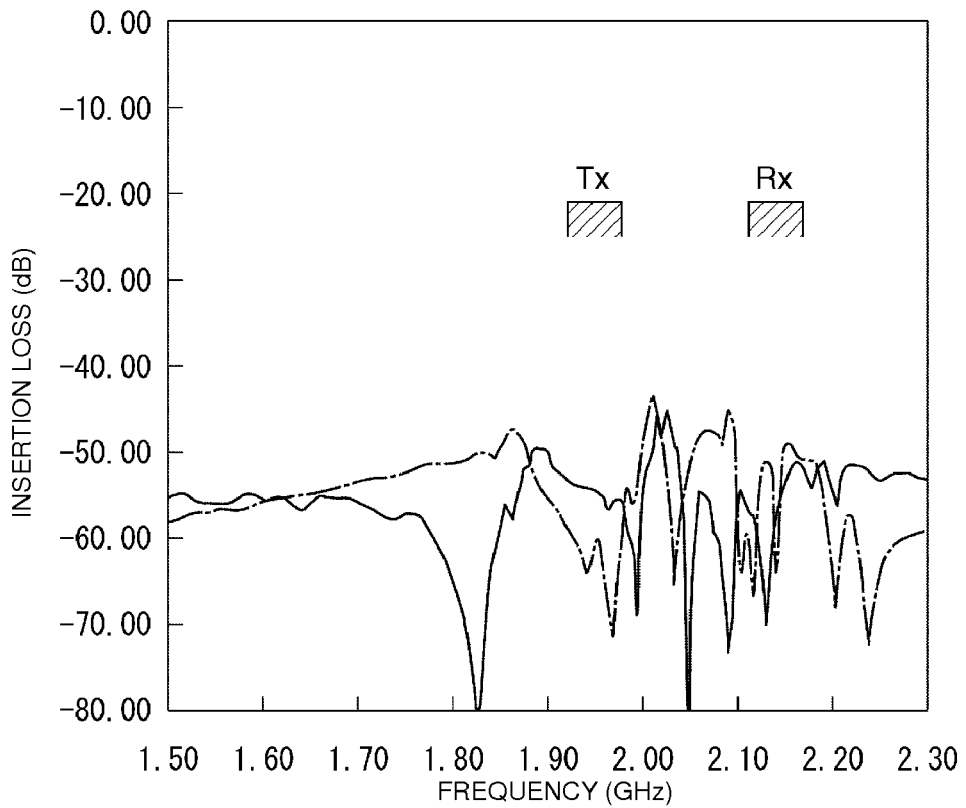
FIG. 18 is a graph illustrating the differential isolation in the duplexer chip and the differential isolation in the high-frequency module according to the first preferred embodiment of the present invention, where a solid line represents the differential isolation in the high-frequency module according to the first preferred embodiment of the present invention, and an alternate long and short dash line represents the differential isolation in the duplexer chip.

As indicated by the above-described results, by making the relationship between the distances $L_3$ and $L_4$ in the duplexer chip 50 the reverse of the relationship between the distances $L_{13}$ and $L_{14}$ on the back surface 13b, the difference in unbalanced isolation between the first and second balanced signal terminals is significantly reduced in the transmitting frequency range. As a result, as indicated by the results shown in FIGS. 16 to 18, the differential isolation determined by a characteristic between the transmitting side signal terminal and the first balanced signal terminal and a characteristic between the transmitting side signal terminal and the second balanced signal terminal in the transmitting frequency range is significantly increased. More specifically, as shown in FIG. 17, in the transmitting frequency range from about 1.92 GHz to about 1.98 GHz, in the high-frequency module of the comparative example, the differential isolation of the high-frequency module indicated by the solid line is less than that of the duplexer chip alone indicated by the alternate long and short dash line. In contrast, as shown in FIG. 18, according to the first preferred embodiment, the differential isolation of the high-frequency module indicated by the solid line is greater than that of the duplexer chip alone indicated by the alternate long and short dash line. Accordingly, as shown in FIG. 16, in the transmitting frequency range from about 1.92 GHz to about 1.98 GHz, the differential isolation of the high-frequency module of the first preferred embodiment indicated by the solid line is greater than that of the high-frequency module of the comparative example indicated by the alternate long and short dash line. More specifically, as indicated by TABLEs 1 and 2 below, the minimum value of the differential isolation in a receiving frequency range from about 2.11 GHz to about 2.17 GHz was about 57.0 dB in the duplexer chip alone, was about 54.0 dB in the first preferred embodiment, and was about 48.9 dB in the comparative example.

TABLE 1

| Comparative example | Duplexer chip alone | High-frequency module | Difference |
|---|---|---|---|
| Unbalanced isolation | DPX-S32: 51.0 dB<br>DPX-S42: 54.8 dB | Mod-S32: 46.5 dB<br>Mod-S42: 60.4 dB | −4.5 dB<br>+5.6 dB |
| Differential isolation | 57.0 dB | 48.9 dB | −8.1 dB |

TABLE 2

| First preferred embodiment | Duplexer chip alone | High-frequency module | Difference |
|---|---|---|---|
| Unbalanced isolation | DPX-S32: 51.0 dB<br>DPX-S42: 54.8 dB | Mod-S32: 46.3 dB<br>Mod-S42: 45.8 dB | −4.7 dB<br>−9.0 dB |
| Differential isolation | 57.0 dB | 54.0 dB | −3.0 dB |

Note that in TABLEs 1 and 2,
DPX-S32: the unbalanced isolation between the transmitting side signal terminal and the first balanced signal terminal in the duplexer chip alone at a frequency of 1.95 GHz,
DPX-S42: the unbalanced isolation between the transmitting side signal terminal and the second balanced signal terminal in the duplexer chip alone at a frequency of 1.95 GHz,
Mod-S32: the unbalanced isolation between the transmitting side signal terminal and the first balanced signal terminal in the high-frequency module at a frequency of 1.95 GHz, and
Mod-S42: the unbalanced isolation between the transmitting side signal terminal and the second balanced signal terminal in the high-frequency module at a frequency of 1.95 GHz.

The values of the differential isolation in TABLEs 1 and 2 represent the minimum values in a transmitting frequency range from about 1.92 GHz to about 1.98 GHz.

The advantages of increasing the differential attenuation are described next.

Figure 19:
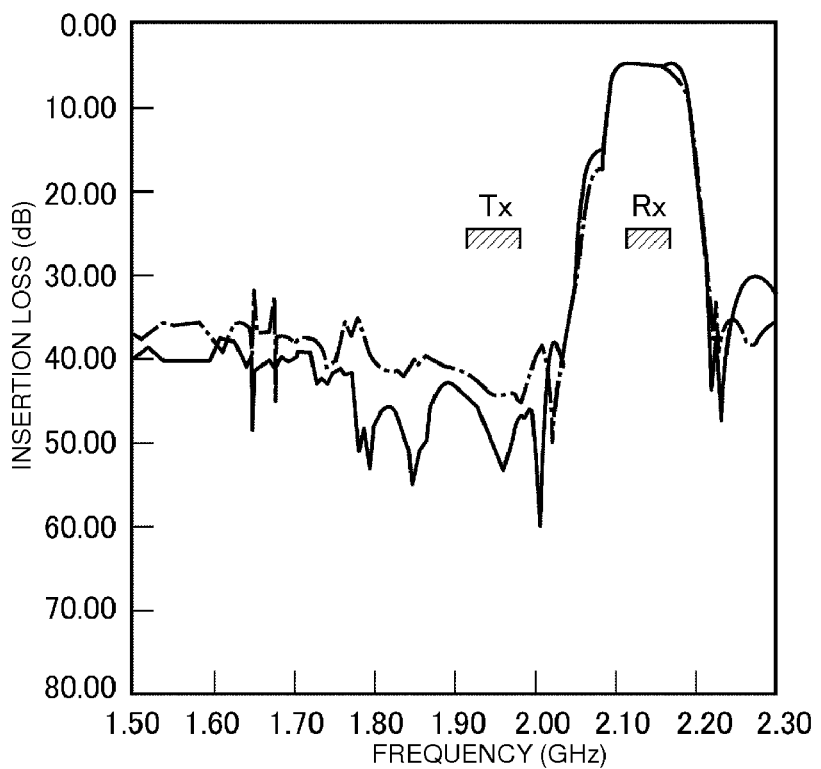
FIG. 19 is a graph illustrating the unbalanced Rx attenuation between an antenna terminal and a first balanced signal terminal and the unbalanced Rx attenuation between the antenna terminal and a second balanced signal terminal in a duplexer chip alone, where a solid line represents the unbalanced Rx attenuation between an antenna terminal and a first balanced signal terminal, and an alternate long and short dash line represents the unbalanced Rx attenuation between the antenna terminal and a second balanced signal terminal.

An unbalanced Rx attenuation between the attenuation between the antenna terminal and the first balanced terminal and the attenuation between the antenna terminal and the second balanced terminal of the duplexer chip 50 is described first with reference to FIG. 19. Note that in FIG. 19, the unbalanced Rx attenuation between the antenna terminal and the first balanced signal terminal of the duplexer chip 50 is represented by a solid line, and the unbalanced Rx attenuation between the antenna terminal and the second balanced signal terminal of the duplexer chip 50 is represented by an alternate long and short dash line.

From FIG. 19, it can be seen that, in the duplexer chip 50 alone, the unbalanced Rx isolation between the antenna terminal and the first balanced signal terminal differs from the unbalanced Rx attenuation between the antenna terminal and the second balanced signal terminal in the transmitting frequency range.

More specifically, at a frequency of about 1.95 GHz, the unbalanced Rx attenuation between the antenna terminal and the first balanced signal terminal was about 49.8 dB. In contrast, the unbalanced Rx attenuation between the antenna terminal and the second balanced signal terminal was about 44.1 dB. Thus, the difference is about 5.7 dB. This is because the distances $L_1$ between the antenna terminal 54 and the first balanced signal terminal 56 differs from the distance $L_2$ between the antenna terminal 54 and the second balanced signal terminal 57.

Figure 20:
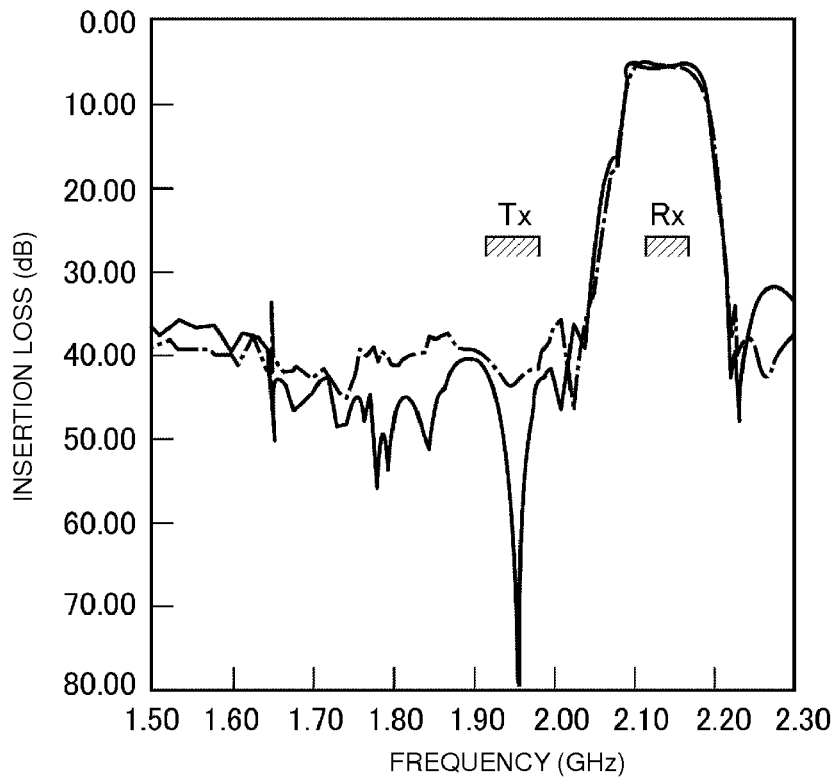
FIG. 20 is a graph illustrating the unbalanced Rx attenuation between an antenna terminal and a first balanced signal terminal and the unbalanced Rx attenuation between the antenna terminal and a second balanced signal terminal in a high-frequency module of the comparative example, where a solid line represents the unbalanced Rx attenuation between an antenna terminal and a first balanced signal terminal, and an alternate long and short dash line represents the unbalanced isolation between the antenna terminal and a second balanced signal terminal.

FIG. 20 is a graph illustrating the unbalanced Rx attenuation of the high-frequency module of the comparative example. In FIG. 20, the unbalanced Rx attenuation between the antenna terminal and the first balanced signal terminal of the duplexer chip 50 alone is represented by a solid line, and the unbalanced Rx attenuation between the antenna terminal and the second balanced signal terminal is represented by an alternate long and short dash line. From a comparison of FIGS. 19 and 20, the difference between the unbalanced Rx attenuations in the transmitting frequency range of the high-frequency module according to the comparative example is greater than the difference between the unbalanced Rx attenuations in the transmitting frequency range of the duplexer chip 50 alone. That is, by mounting the duplexer chip 50 on the circuit board 10, a difference between the unbalanced Rx attenuation between the antenna terminal and the first balanced signal terminal and the unbalanced Rx attenuation between the antenna terminal and the second balanced signal terminal is increased in the transmitting frequency range.

More specifically, in the high-frequency module of the comparative example, at a frequency of about 1.95 GHz, the unbalanced Rx attenuation between the antenna terminal and the first balanced signal terminal was about 58.2 dB. In contrast, the unbalanced Rx attenuation between the antenna terminal and the second balanced signal terminal was about 44.0 dB. By mounting the duplexer chip 50 on the circuit board 10, the unbalanced Rx attenuation between the antenna terminal and the first balanced signal terminal was increased to about 8.4 dB at a frequency of about 1.95 GHz. In contrast, the unbalanced Rx attenuation between the antenna terminal and the second balanced signal terminal was decreased by about 0.1 dB. As a result, at a frequency of about 1.95 GHz, the difference between the unbalanced Rx attenuation between the antenna terminal and the first balanced signal terminal and the unbalanced Rx attenuation between the antenna terminal and the second balanced signal terminal is increased from about 5.7 dB to about 14.2 dB.

This is because, in the comparative example, the positional relationship between the first and second balanced signal terminals with respect to the antenna terminal in the duplexer chip 50 is the same as that on the back surface 13b. That is, in the comparative example, the relationship between the distances $L_1$ and $L_2$ in the duplexer chip 50 is the same as the relationship between the distances $L_{11}$ and $L_{12}$ on the back surface 13b.

Figure 21:
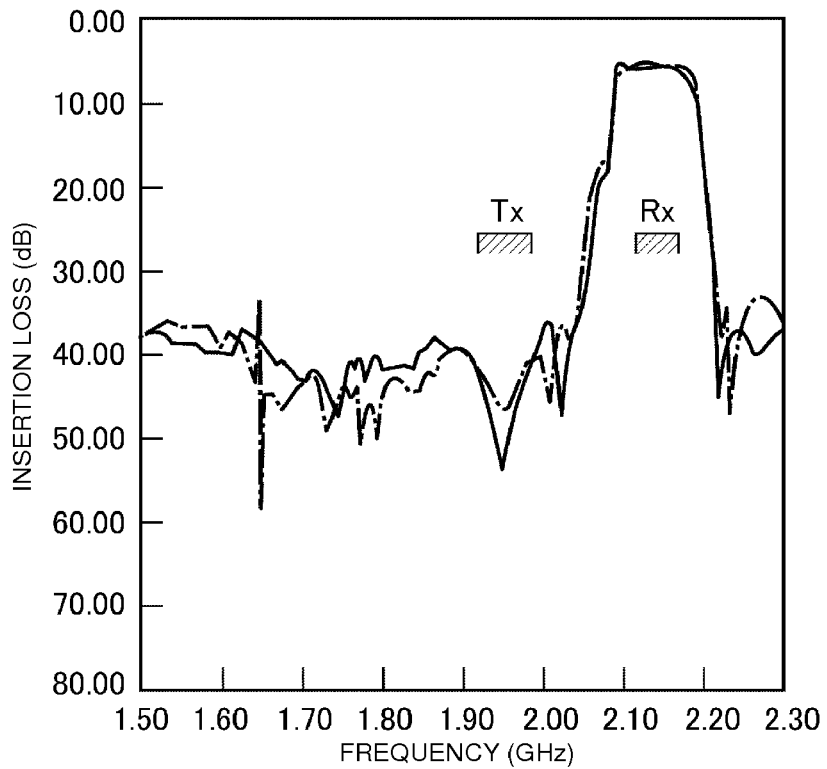
FIG. 21 is a graph illustrating the unbalanced Rx attenuation between an antenna terminal and a first balanced signal terminal and the unbalanced Rx attenuation between the antenna terminal and a second balanced signal terminal in a high-frequency module according to the first preferred embodiment of the present invention, where a solid line represents the unbalanced Rx attenuation between an antenna terminal and a first balanced signal terminal, and an alternate long and short dash line represents the unbalanced isolation between the antenna terminal and a second balanced signal terminal.

FIG. 21 is a graph illustrating the unbalanced Rx attenuation of the high-frequency module according to the first preferred embodiment. In FIG. 21, the unbalanced Rx attenuation between the antenna terminal and the first balanced signal terminal in the duplexer chip 50 alone is represented by a solid line, and the unbalanced Rx attenuation between the antenna terminal and the second balanced signal terminal is represented by an alternate long and short dash line. In the comparative example, the relationship between the distances $L_1$ and $L_2$ in the duplexer chip 50 is the same as the relationship between the distances $L_{11}$ and $L_{12}$ on the back surface 13b. However, according to the first preferred embodiment, the relationship between the distances $L_1$ and $L_2$ in the duplexer chip 50 is the reverse of the relationship between the distances $L_{11}$ and $L_{12}$ on the back surface 13b. Accordingly, as can be seen from a comparison of FIGS. 19 and 21, according to the first preferred embodiment, in the duplexer chip 50 mounted on the circuit board 10, the difference between the unbalanced Rx attenuation between the antenna terminal and the first balanced signal terminal and the unbalanced Rx attenuation between the antenna terminal and the second balanced signal terminal in the transmitting frequency range is less than that in the duplexer chip 50 alone. More specifically, in the high-frequency module of the first preferred embodiment, at a frequency of about 1.95 GHz, the unbalanced Rx attenuation between the antenna terminal and the first balanced signal terminal was about 51.2 dB. In contrast, the unbalanced Rx attenuation between the antenna terminal and the second balanced signal terminal was about 46.6 dB. By mounting the duplexer chip 50 on the circuit board 10, the unbalanced Rx attenuation between the antenna terminal and the first balanced signal terminal was increased by about 1.4 dB at a frequency of about 1.95 GHz. In contrast, the unbalanced Rx attenuation between the antenna terminal and the second balanced signal terminal was increased by about 2.5 dB. As a result, at a frequency of about 1.95 GHz, the difference between the unbalanced Rx attenuation between the antenna terminal and the first balanced signal terminal and the unbalanced Rx attenuation between the antenna terminal and the second balanced signal terminal is significantly decreased from about 14.2 dB to about 4.6 dB.

Figure 22:
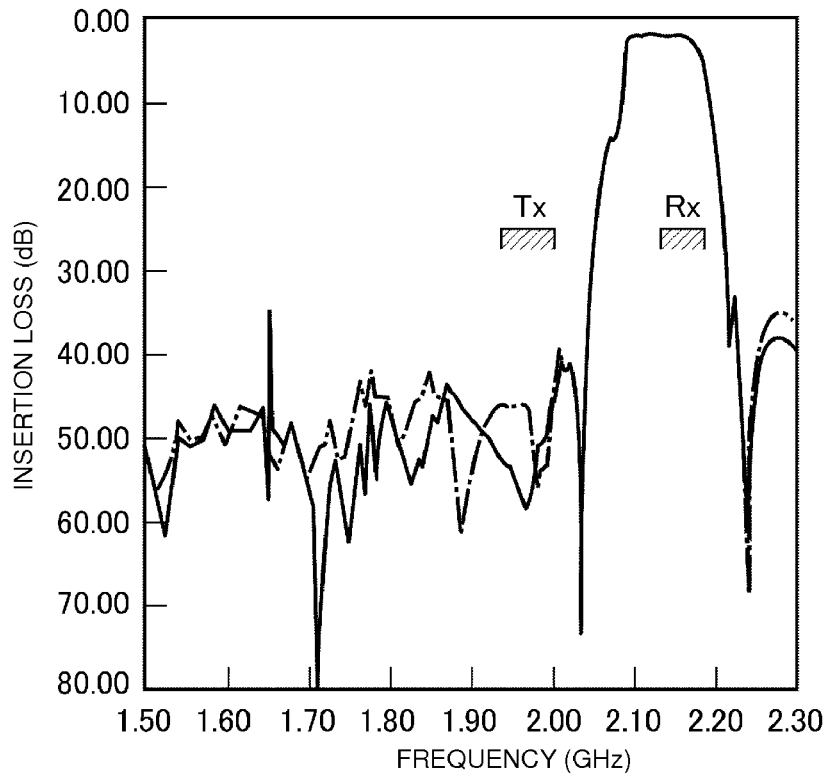
FIG. 22 is a graph illustrating the differential Rx attenuation in the high-frequency module according to the first preferred embodiment of the present invention and the differential Rx attenuation in the high-frequency module of the comparative example, where a solid line represents the differential Rx attenuation in the high-frequency module according to the first preferred embodiment of the present invention, and an alternate long and short dash line represents the differential Rx attenuation in the high-frequency module of the comparative example.
Figure 23:
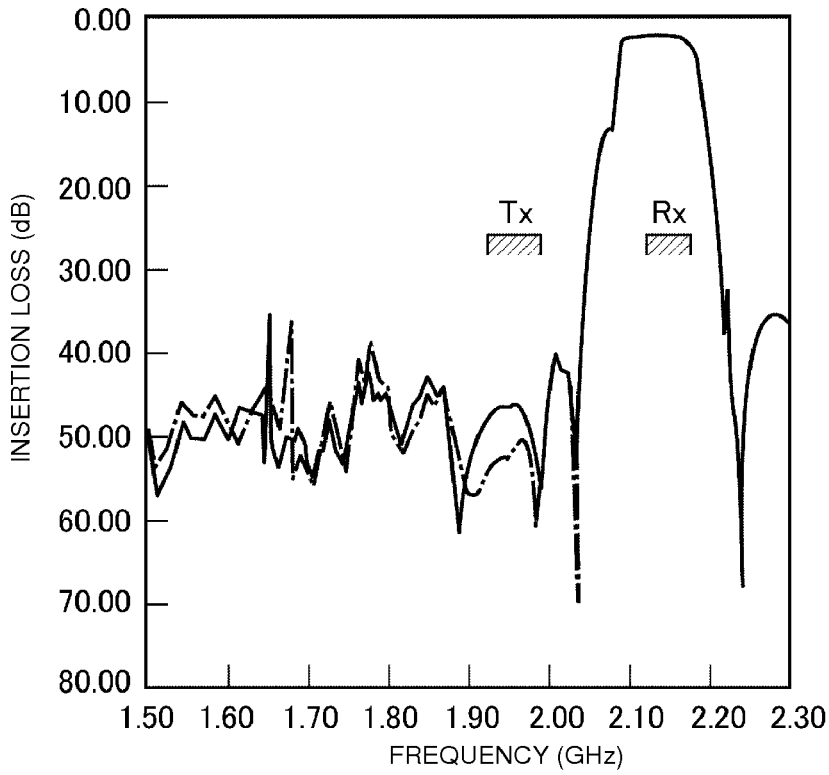
FIG. 23 is a graph illustrating the differential Rx attenuation in the duplexer chip and the differential Rx attenuation in the high-frequency module of the comparative example, where a solid line represents the differential Rx attenuation in the high-frequency module of the comparative example, and an alternate long and short dash line represents the differential Rx attenuation in the duplexer chip.
Figure 24:
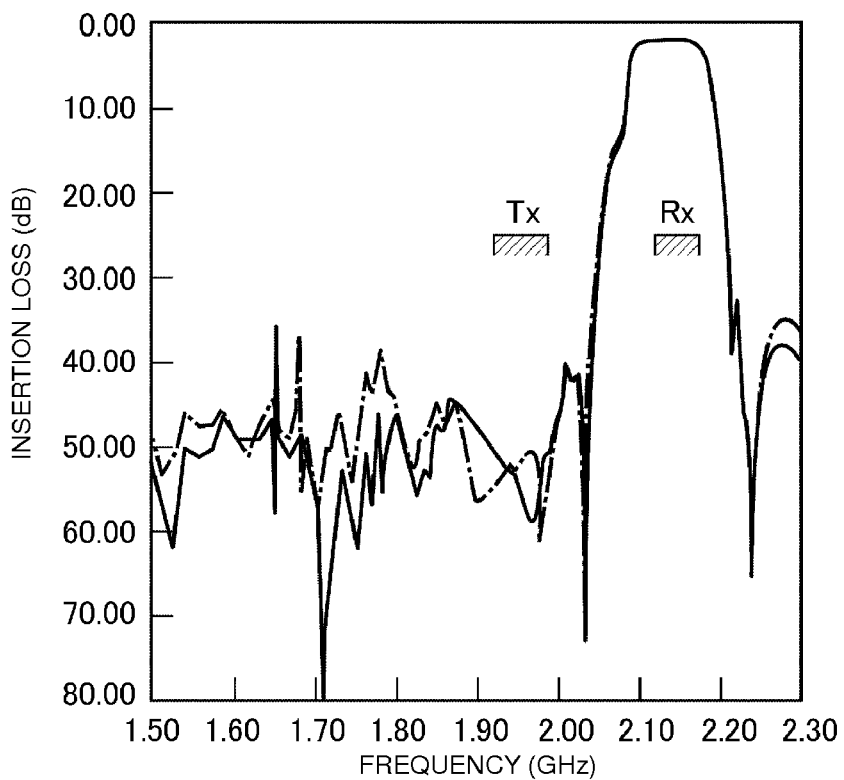
FIG. 24 is a graph illustrating the differential Rx attenuation in the duplexer chip and the differential Rx attenuation in the high-frequency module according to the first preferred embodiment of the present invention, where a solid line represents the differential Rx attenuation in the high-frequency module of the first preferred embodiment of the present invention, and an alternate long and short dash line represents the differential Rx attenuation in the duplexer chip.
Figure 25:
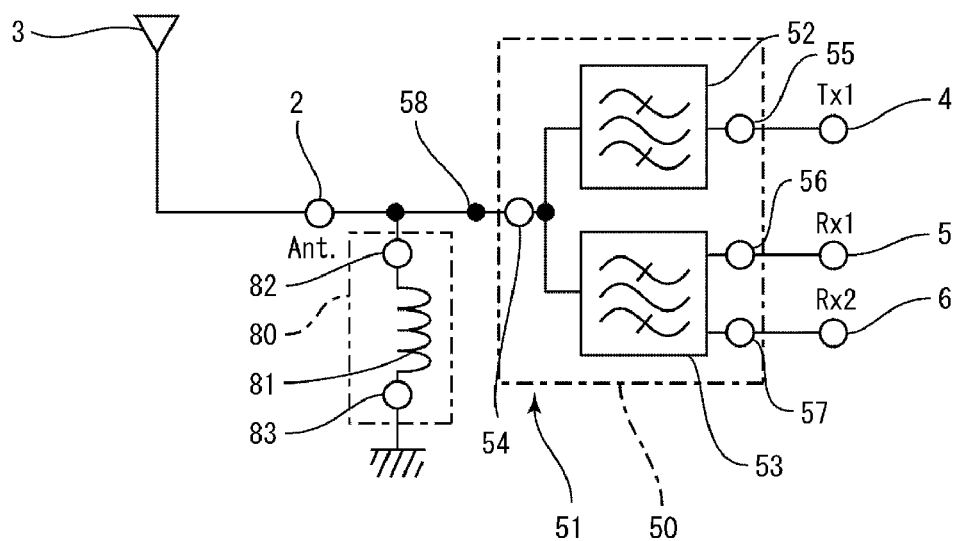
FIG. 25 is a schematic equivalent circuit diagram of a high-frequency module according to a second preferred embodiment of the present invention.
Figure 26:
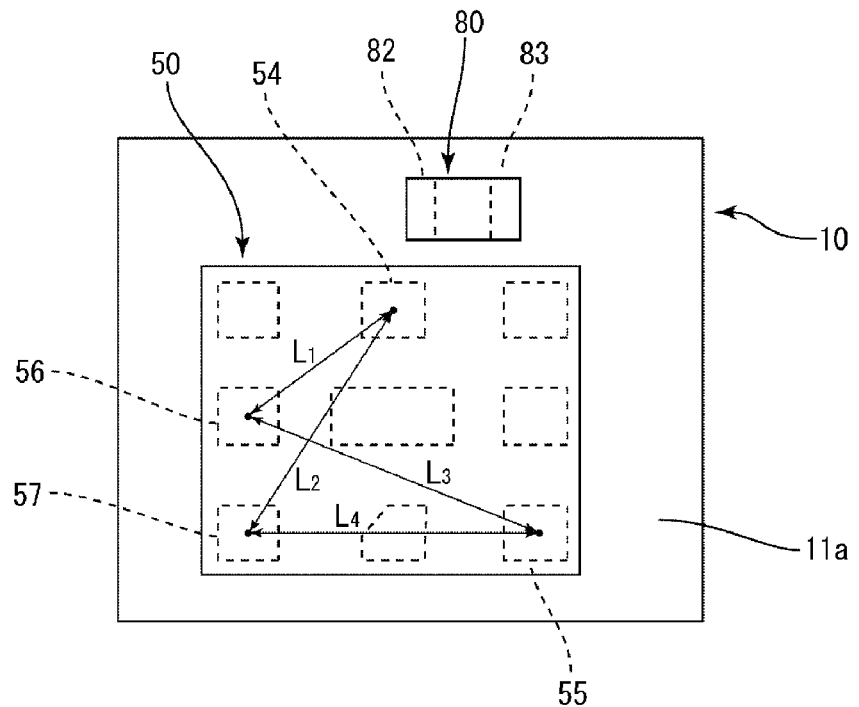
FIG. 26 is a plan view of the high-frequency module according to the second preferred embodiment of the present invention.
Figure 27:
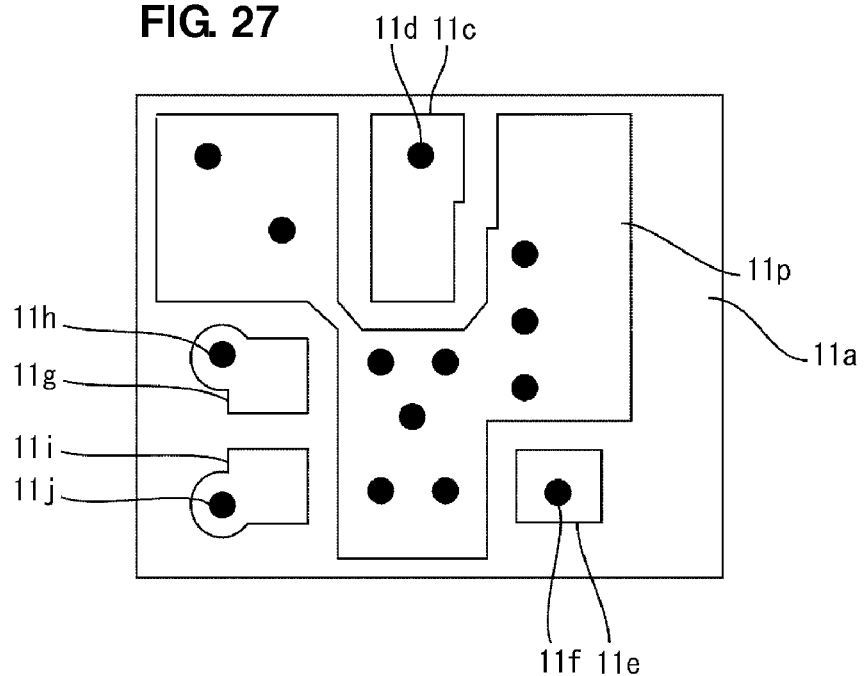
FIG. 27 is a plan view of a mounting surface of a first substrate according to the second preferred embodiment of the present invention.
Figure 28:
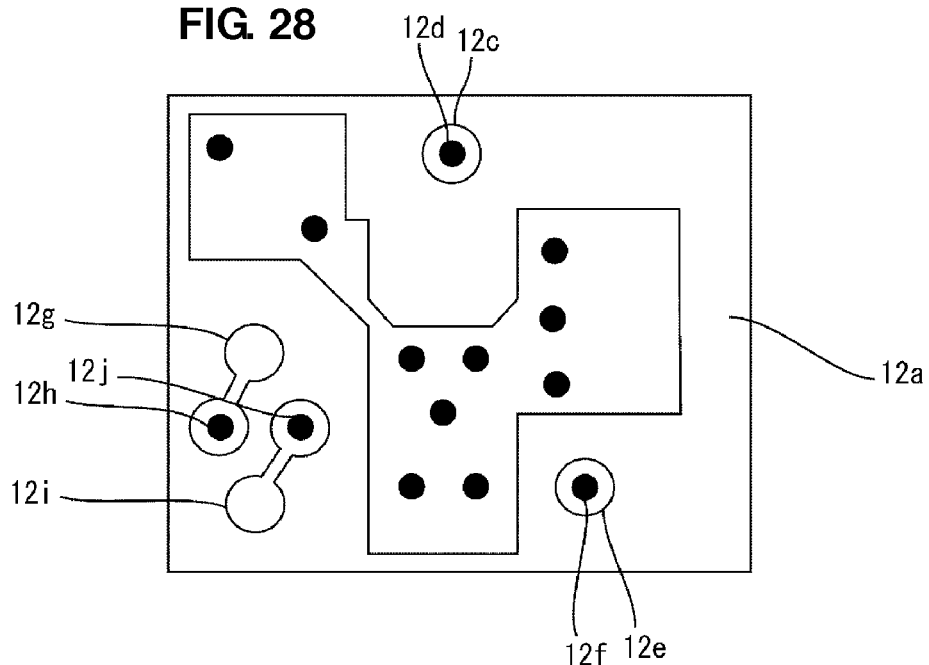
FIG. 28 is a plan view of the first principal surface of a second substrate according to the second preferred embodiment of the present invention.
Figure 29:
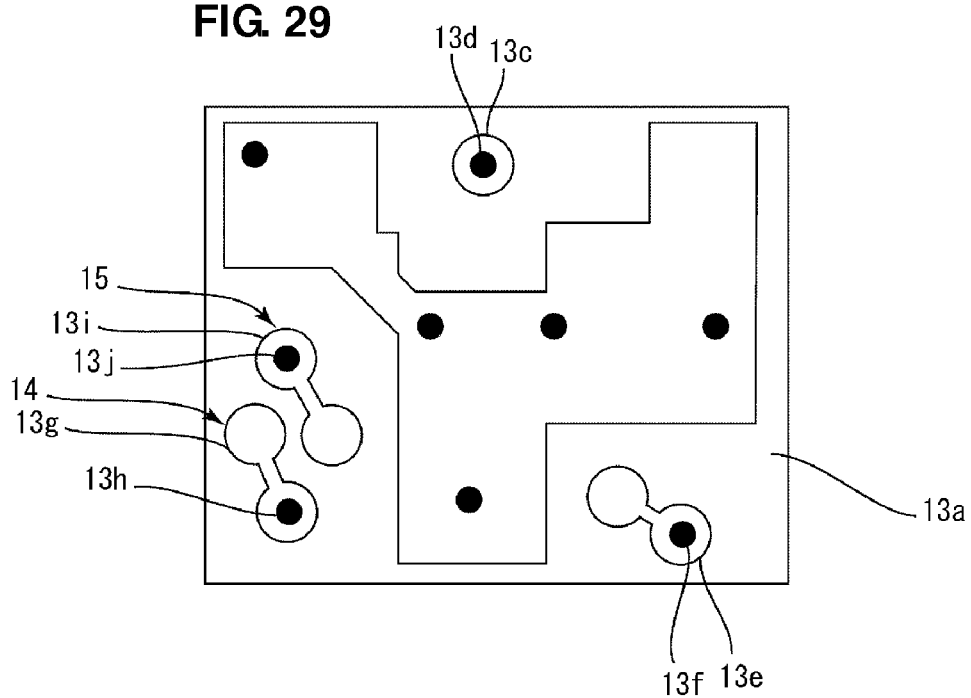
FIG. 29 is a plan view of the first principal surface of a third substrate according to the second preferred embodiment of the present invention.
Figure 30:
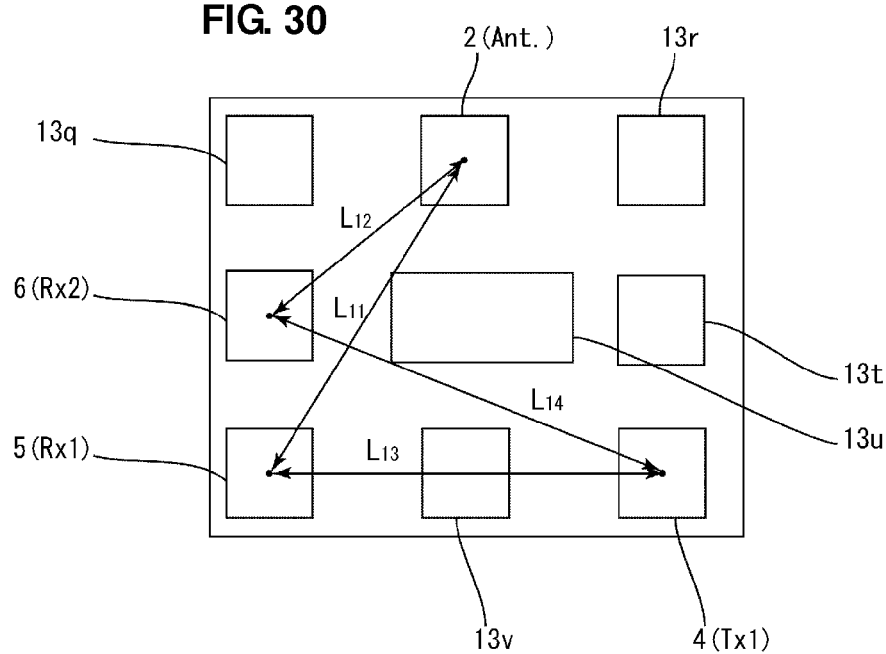
FIG. 30 is a bottom view of the high-frequency module according to the second preferred embodiment of the present invention.

As indicated by the above-described results, by making the relationship between the distances $L_1$ and $L_2$ in the duplexer chip 50 the reverse of the relationship between the distances $L_{11}$ and $L_{12}$ on the back surface 13b, the difference between the unbalanced Rx attenuation between the antenna terminal and the first unbalanced signal terminal in the duplexer chip 50 and the unbalanced Rx attenuation between the antenna terminal and the second unbalanced signal terminal is significantly reduced in the transmitting frequency range. As a result, as indicated by the results shown in FIGS. 22 to 24, the differential Rx attenuation of the high-frequency module in the transmitting frequency range is significantly increased. More specifically, as shown in FIG. 23, in the transmitting frequency range, the differential Rx attenuation of the high-frequency module of the comparative example indicated by the solid line is less than the differential Rx attenuation of the duplexer chip alone indicated by the alternate long and short dash line. In contrast, as shown in FIG. 24, according to the first preferred embodiment, the differential Rx attenuation of the high-frequency module indicated by the solid line is greater than the differential Rx attenuation of the duplexer chip alone indicated by the alternate long and short dash line. Accordingly, as shown in FIG. 22, in the transmitting frequency (Tx) range, the differential Rx attenuation of the high-frequency module of the first preferred embodiment indicated by the solid line is greater than the differential Rx attenuation of the high-frequency module of the comparative example indicated by the alternate long and short dash line. More specifically, the maximum value of the differential Rx attenuation in a transmitting frequency range in the duplexer chip alone was about 50.4 dB, was about 51.2 dB in the first preferred embodiment, and was about 46.1 dB in the comparative example.

Note that, according to the first preferred embodiment, an example in which the relationship between the distances $L_1$ and $L_2$ on the mounting surface 11a is preferably the reverse of the relationship between the distances $L_{11}$ and $L_{12}$ on the back surface 13b and the relationship between the distances $L_3$ and $L_4$ on the mounting surface 11a is preferably the reverse of the relationship between the distances $L_{13}$ and $L_{14}$ on the back surface 13b has been described. However, the present invention is not limited to such a structure. For example, only the relationship between the distances $L_1$ and $L_2$ on the mounting surface 11a may be the reverse of the relationship between the distances $L_{11}$ and $L_{12}$ on the back surface 13b. Alternatively, only the relationship between the distances $L_3$ and $L_4$ on the mounting surface 11a may be the reverse of the relationship between the distances $L_{13}$ and $L_{14}$ on the back surface 13b.

Another exemplary preferred embodiment of the present invention is described below. Note that components of the second preferred embodiment having functions substantially the same as those of the first preferred embodiment are denoted by the same reference numerals as those used for corresponding components of the first preferred embodiment, and the descriptions thereof are not repeated.

Second Preferred Embodiment

In the first preferred embodiment, an example in which a triplexer preferably defines a demultiplexer is described. However, a demultiplexer mounted in a high-frequency module according to another preferred embodiment of the present invention may be a duplexer, instead of a triplexer, for example. More specifically, as shown in FIGS. 25 to 30, unlike the first preferred embodiment, a high-frequency module according to the second preferred embodiment of the present invention preferably does not include the transmitting side filter chip 70. Consequently, according to the second preferred embodiment, the high-frequency module supports UMTS-Band1 (Tx: 1.92 to 1.98 GHz, Rx: 2.11 to 2.17 GHz).

Similar to the first preferred embodiment, according to the second preferred embodiment, the relationship between the distances $L_1$ and $L_2$ on the mounting surface 11a is preferably the reverse of the relationship between the distances $L_{11}$ and $L_{12}$ on the back surface 13b, and the relationship between the distances $L_3$ and $L_4$ on the mounting surface 11a is preferably the reverse of the relationship between the distances $L_{13}$ and $L_{14}$ on the back surface 13b. Therefore, in the second preferred embodiment, the differential isolation and differential attenuation is improved.

Third Preferred Embodiment

Figure 31:
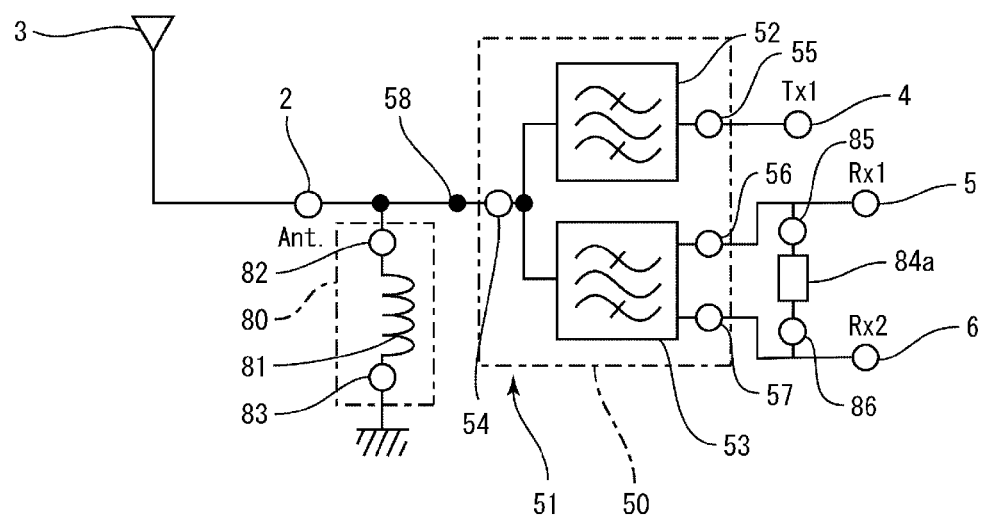
FIG. 31 is a schematic equivalent circuit diagram of a high-frequency module according to a third preferred embodiment of the present invention.
Figure 32:
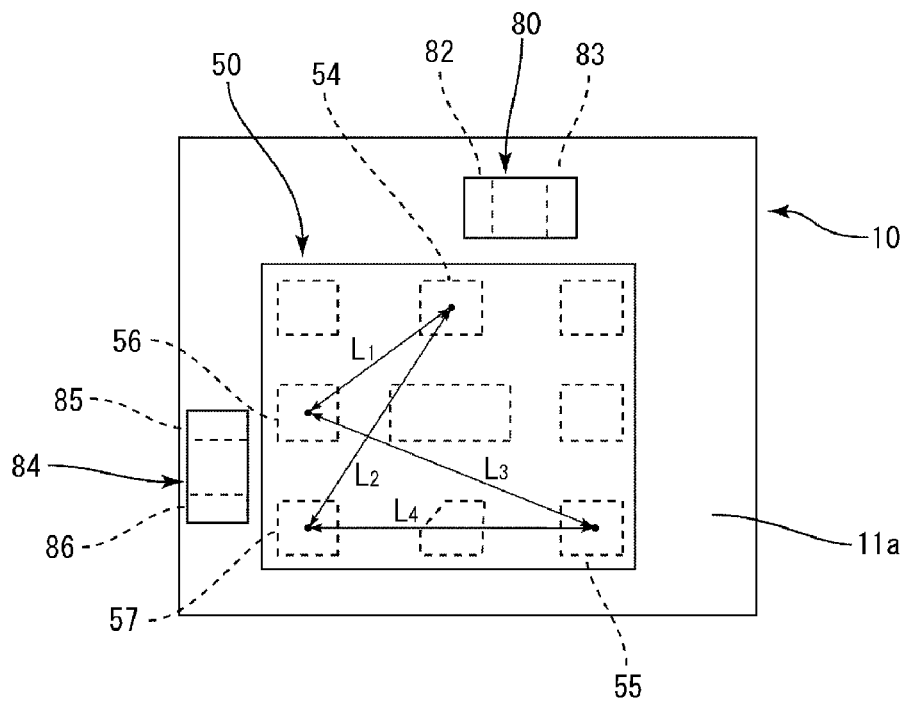
FIG. 32 is a plan view of the high-frequency module according to the third preferred embodiment of the present invention.
Figure 33:
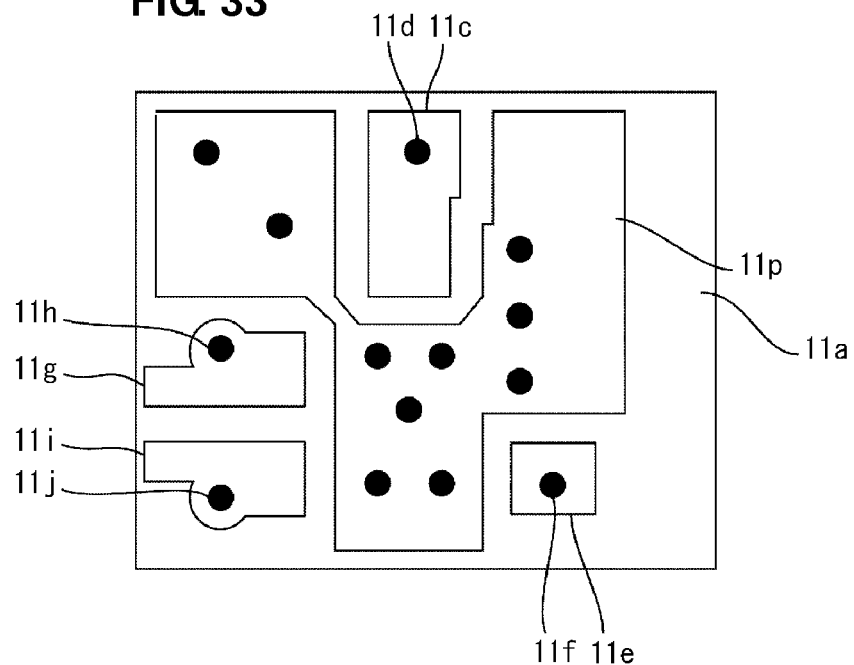
FIG. 33 is a plan view of a mounting surface of a first substrate according to the third preferred embodiment of the present invention.

FIG. 31 is an equivalent circuit diagram of a high-frequency module according to a third preferred embodiment of the present invention. As shown in FIG. 31, according to the third preferred embodiment, the high-frequency module preferably includes a matching circuit 84a that is connected between a connection point of the first balanced signal terminals 56 and 5 of the duplexer and a connection point of the second balanced signal terminals 57 and 6 according to the second preferred embodiment. FIG. 32 is a plan view of a duplexer module according to the third preferred embodiment. FIG. 33 is a plan view of a mounting surface of a first substrate. A plan view of a first principal surface of a second substrate, a plan view of a first principal surface of a third substrate, and a plan view of a back surface are the same as those illustrated in FIGS. 28, 29, and 30 of the second preferred embodiment, respectively.

As shown in FIG. 32, according to the third preferred embodiment, a matching circuit chip 84 including the matching circuit 84a provided therein is preferably mounted on the mounting surface 11a of the circuit board 10. More specifically, the matching circuit chip 84 is preferably an inductor chip. A first electrode 85 of the matching circuit chip 84 is connected to a portion extending from the electrode 11g (a third front surface side electrode pad). In contrast, a second electrode 86 of the matching circuit chip 84 is connected to a portion extending from the electrode 11i (a fourth front surface side electrode pad). On the electrodes 11g and 11i, the matching circuit chip 84 is preferably connected between a connection point between the first balanced signal terminals 56 and 5 and a connection point between the second balanced signal terminals 57 and 6. Accordingly, the matching circuit chip 84 is connected between the first balanced signal terminal and a second balanced signal terminal on the third front surface side electrode pad and the fourth front surface side electrode pad.

Similar to the first and second preferred embodiments, according to the third preferred embodiment, the differential isolation and differential attenuation are significantly improved.

Fourth Preferred Embodiment

Figure 34:
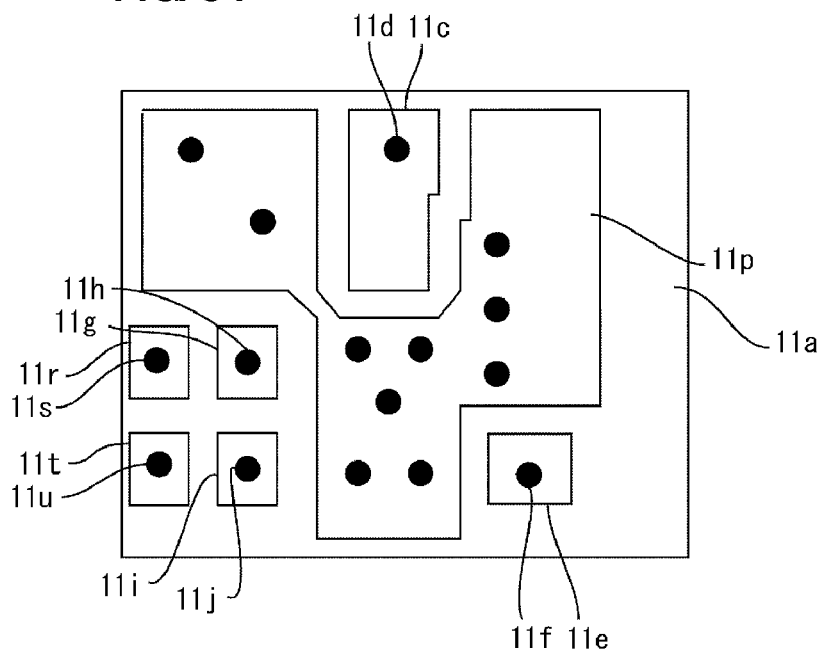
FIG. 34 is a plan view of a mounting surface of a first substrate according to a fourth preferred embodiment of the present invention.
Figure 35:
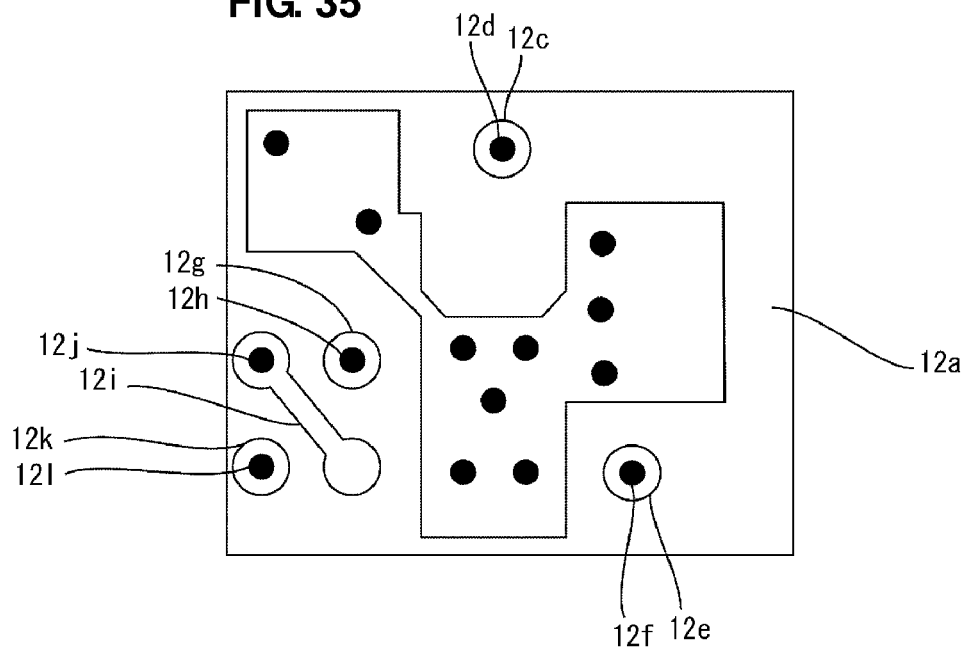
FIG. 35 is a plan view of the first principal surface of a second substrate according to the fourth preferred embodiment of the present invention.
Figure 36:
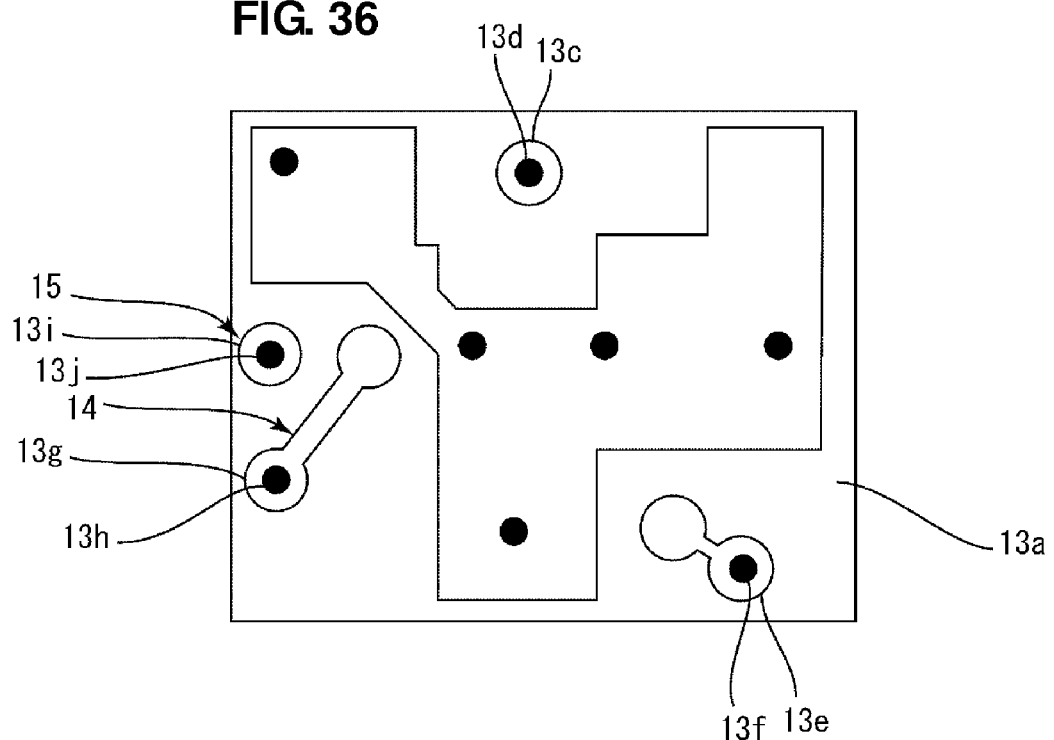
FIG. 36 is a plan view of the first principal surface of a third substrate according to the fourth preferred embodiment of the present invention.
Figure 37:
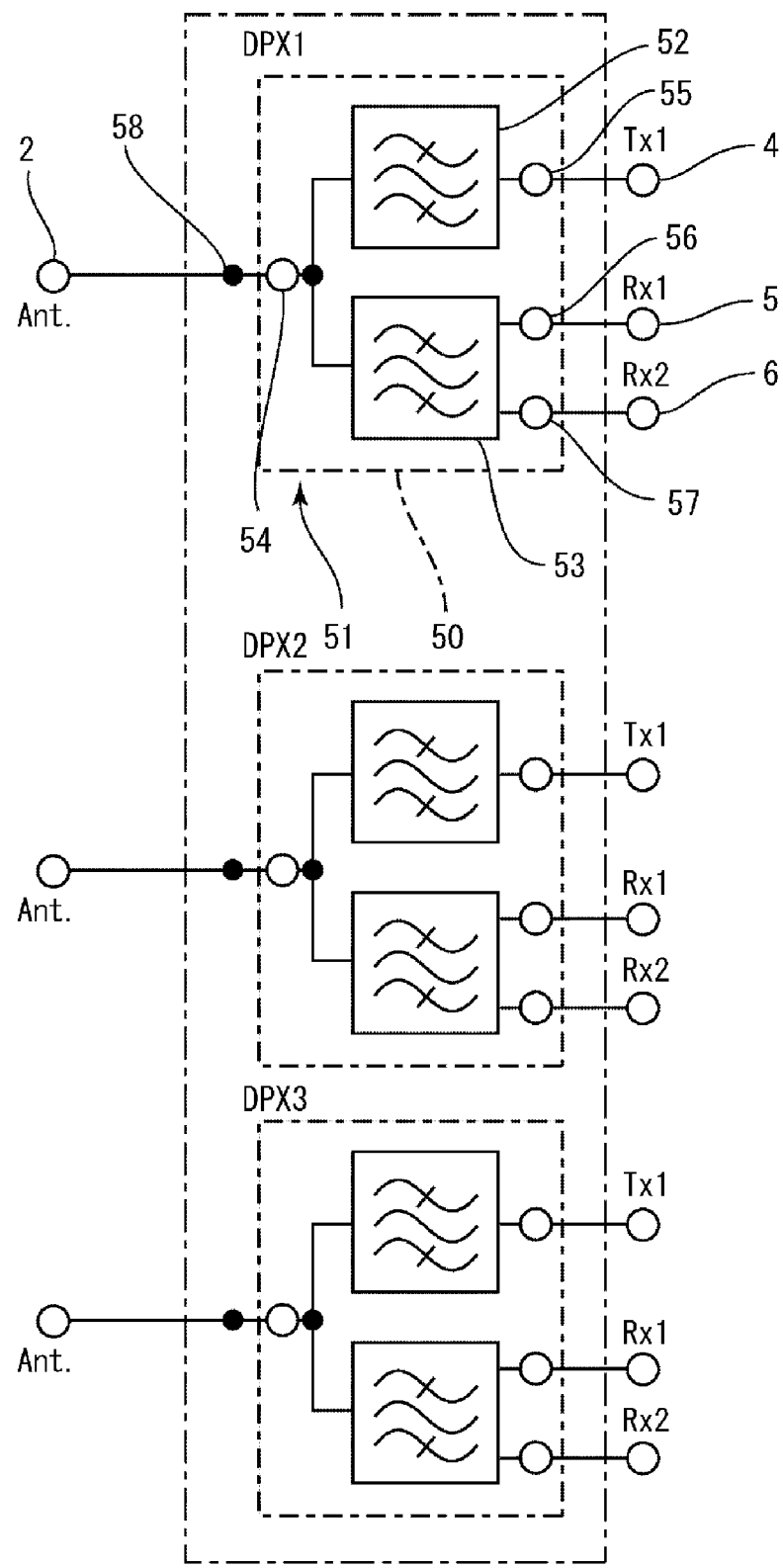
FIG. 37 is a schematic equivalent circuit diagram of a high-frequency module according to a fifth preferred embodiment of the present invention.

FIG. 34 is a plan view of a mounting surface of a first substrate according to a fourth preferred embodiment of the present invention. FIG. 35 is a plan view of a first principal surface of a second substrate according to the fourth preferred embodiment. FIG. 36 is a plan view of a first principal surface of a third substrate according to the fourth preferred embodiment. FIG. 31 of the second preferred embodiment is also applied to the fourth preferred embodiment. In addition, FIGS. 31, 32, and 30 of the above-described preferred embodiments are also applied to the fourth preferred embodiment.

In the third preferred embodiment, the matching circuit chip 84 is preferably connected between the first balanced signal terminal and a second balanced signal terminal on the third front surface side electrode pad and the fourth front surface side electrode pad formed on the mounting surface of the circuit board. However, the fourth preferred embodiment is described with reference to an example in which the matching circuit chip 84 is preferably connected between the first balanced signal terminal and a second balanced signal terminal on the first interconnection line and a second interconnection line formed inside the circuit board.

As shown in FIG. 34, electrodes 11r and 11t are further provided on the mounting surface 11a. The first electrode 85 of the matching circuit chip 84 is connected to the electrode 11r. The electrode 11r is connected to an electrode 12i provided on the first principal surface 12a of the second substrate layer 12 using a via electrode 11s provided in the first substrate layer 11. In addition, the electrode 11i to which the second balanced signal terminal 57 of the duplexer chip 50 is connected is connected to the electrode 12i by the via electrode 11j provided in the first substrate layer 11. Furthermore, the electrode 12i is connected to the second balanced signal terminal 6 provided on the back surface 13b of the circuit board 10 by the via electrode 12j provided in the second substrate layer 12 and the via electrode 13j provided in the third substrate layer 13. Accordingly, the first electrode of the matching circuit chip 84 is connected to the connection point between the second balanced signal terminals 57 and 6. According to the fourth preferred embodiment, the second interconnection line is defined by the via electrodes 11*j*, 12*j*, and 13*j* and the electrode 12*i*.

In contrast, a second electrode 86 of the matching circuit chip 84 is connected to the electrode 11*t*. The electrode 11*t* is connected to an electrode 12*k* provided on the first principal surface 12*a* of the second substrate layer 12 by a via electrode 11*u* provided in the first substrate layer 11. The electrode 12*k* is connected to the electrode 13*g* provided on the first principal surface 13*a* of the third substrate layer 13 via a via electrode 121 provided in the second substrate layer 12. In addition, the electrode 11*g* to which the first balanced signal terminal 56 of the duplexer chip 50 is connected is connected to the electrode 13*g* by the via electrode 11*h* provided in the first substrate layer 11 and the via electrode 12*h* provided in the second substrate layer 12. Furthermore, the electrode 13*g* is connected to the first balanced signal terminal 5 provided on the back surface 13*b* of the circuit board 10 by the via electrode 13*h* provided in the third substrate layer 13. Accordingly, the second electrode 86 of the matching circuit chip 84 is preferably connected to the connection point between the first balanced signal terminals 56 and 5. According to the fourth preferred embodiment, the first interconnection line is defined by the via electrodes 11*h*, 12*h*, and 13*h* and the electrode 13*g*.

As shown in FIGS. 35 and 36, according to the fourth preferred embodiment, the electrode 13*g* that defines a portion of the first interconnection line intersects with the electrode 12*i* that defines a portion of the second interconnection line. Accordingly, the first electrode 85 of the matching circuit chip 84 is connected to a point of the second interconnection line on the side of the electrode 11*i* (the fourth front surface side electrode pad) from the intersection of the second interconnection line and the first interconnection line. In addition, the second electrode 86 of the matching circuit chip 84 is connected to a point of the first interconnection line on the side of the first balanced signal terminal 5 (the third back surface side electrode pad) from the intersection of the first interconnection line and the second interconnection line. It should be noted that a path in which the matching circuit chip 84 is connected to the first interconnection line and the second interconnection line is not limited to that shown in FIGS. 34 to 36. By appropriately arranging the path inside the circuit board 10, the mounting position of the matching circuit chip 84 is not limited to that illustrated in the fourth preferred embodiment, and the matching circuit chip 84 can be arranged at any suitable position. In addition, similar to the first to third preferred embodiments, according to the fourth preferred embodiment, the differential isolation and differential attenuation are improved.

Fifth Preferred Embodiment

While the first to fourth preferred embodiments have been described with reference to a configuration in which a single duplexer chip 50 is preferably provided, preferred embodiments of the present invention are not limited to such a configuration. For example, according to a fifth preferred embodiment of the present invention, a high-frequency module may preferably include a multi-band duplexer module including a plurality of duplexers connected to different antenna terminals.

For example, as shown in FIGS. 37 to 42, three duplexer chips 50 connected to different antenna terminals may be provided. Even in such a case, similar to the first to third preferred embodiments, the relationship between the distances $L_1$ and $L_2$ on the mounting surface 11*a* is preferably the reverse of the relationship between the distances $L_{11}$ and $L_{12}$ on the back surface 13*b*, and the relationship between the distances $L_3$ and $L_4$ on the mounting surface 11*a* is preferably the reverse of the relationship between the distances $L_{13}$ and $L_{14}$ on the back surface 13*b*. Accordingly, the differential isolation and differential attenuation are improved.

Figure 38:
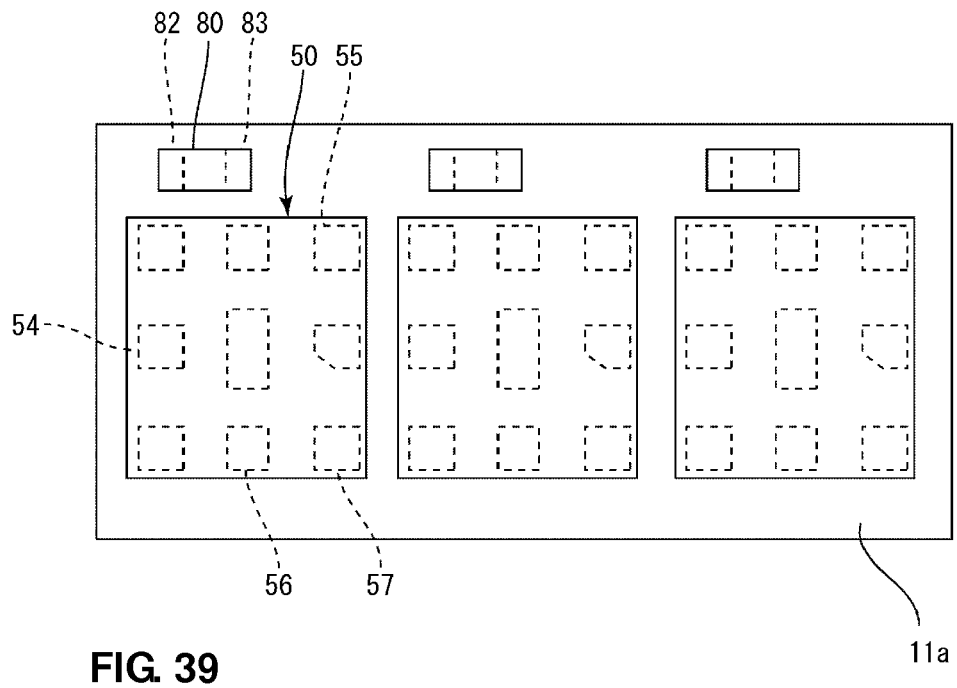
FIG. 38 is a plan view of the high-frequency module according to the fifth preferred embodiment of the present invention.
Figure 39:
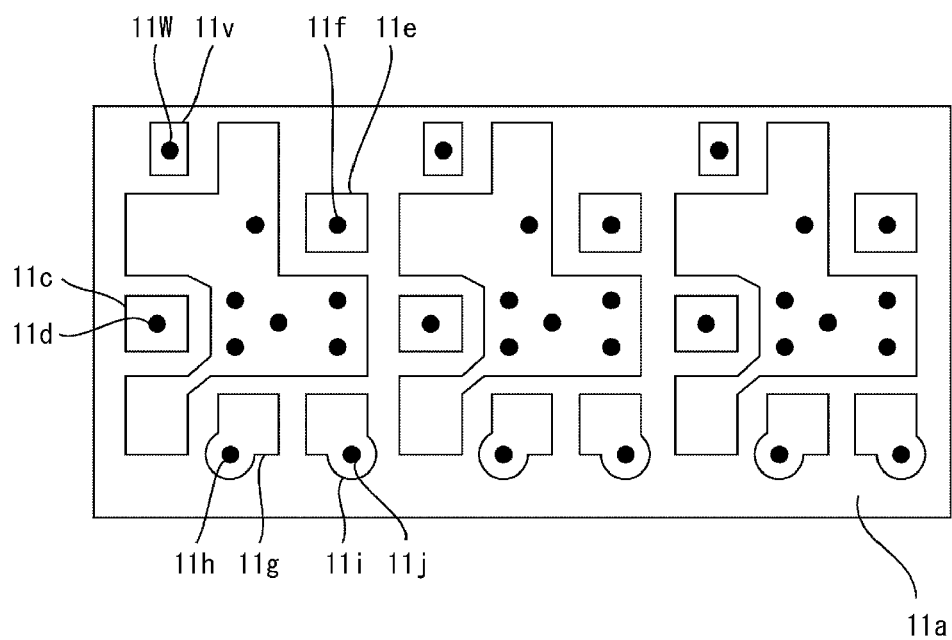
FIG. 39 is a plan view of a mounting surface of a first substrate according to the fifth preferred embodiment of the present invention.
Figure 40:
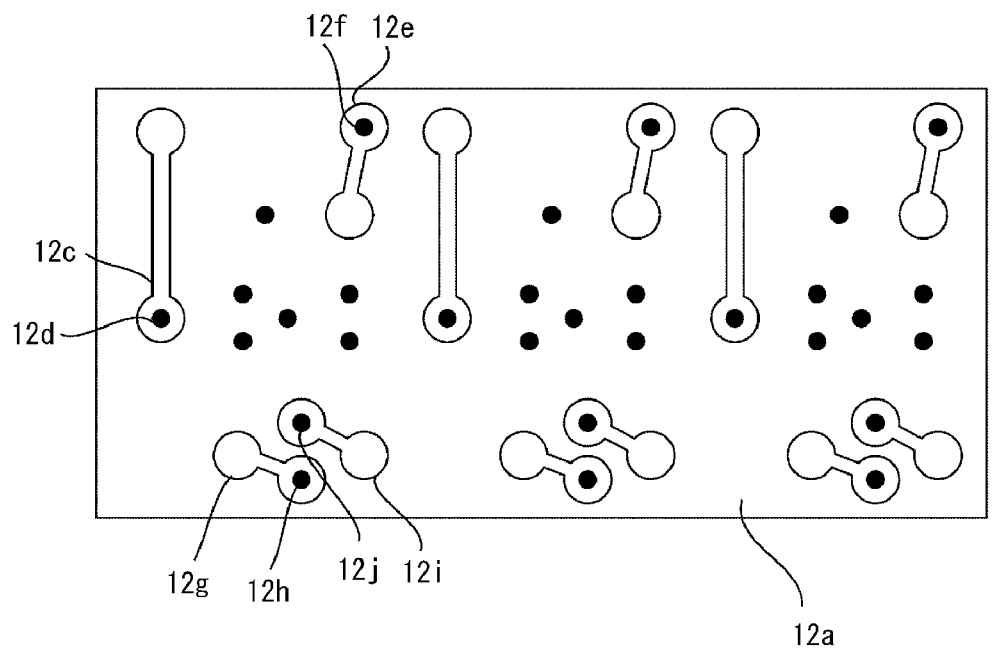
FIG. 40 is a plan view of the first principal surface of a second substrate according to the fifth preferred embodiment of the present invention.
Figure 41:
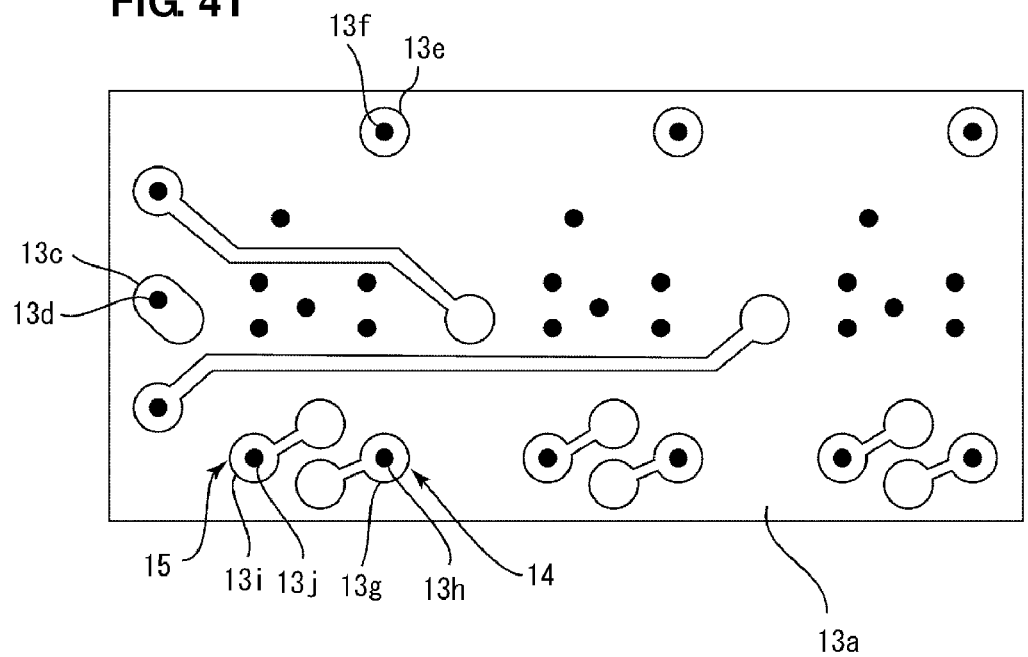
FIG. 41 is a plan view of the first principal surface of a third substrate according to the fifth preferred embodiment of the present invention.
Figure 42:
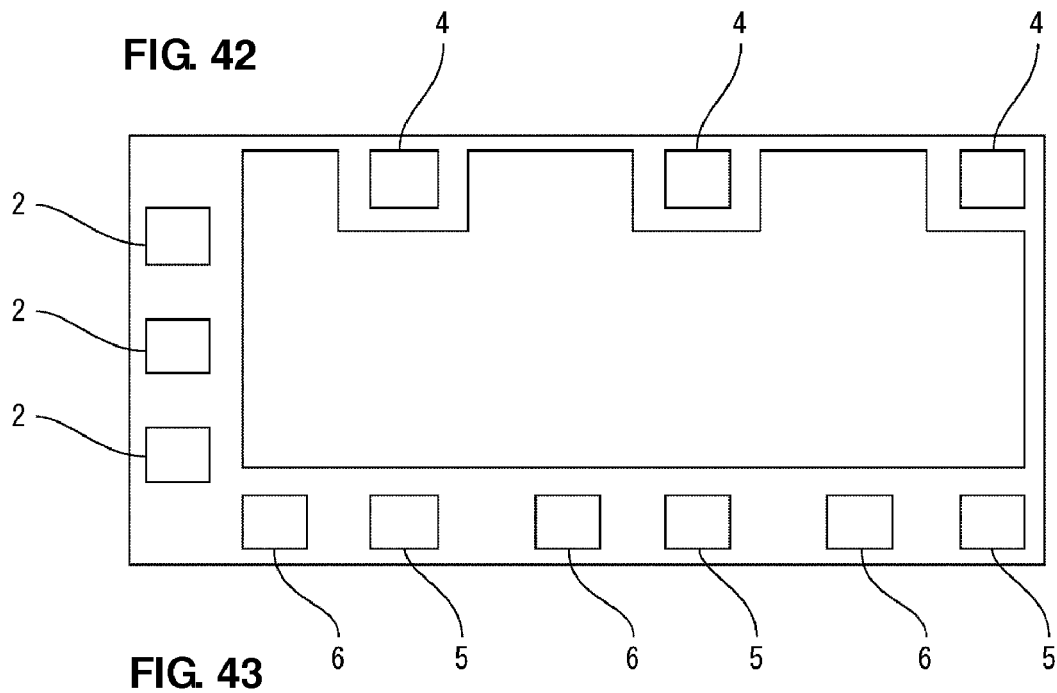
FIG. 42 is a bottom view of the high-frequency module according to the fifth preferred embodiment of the present invention.
Figure 43:
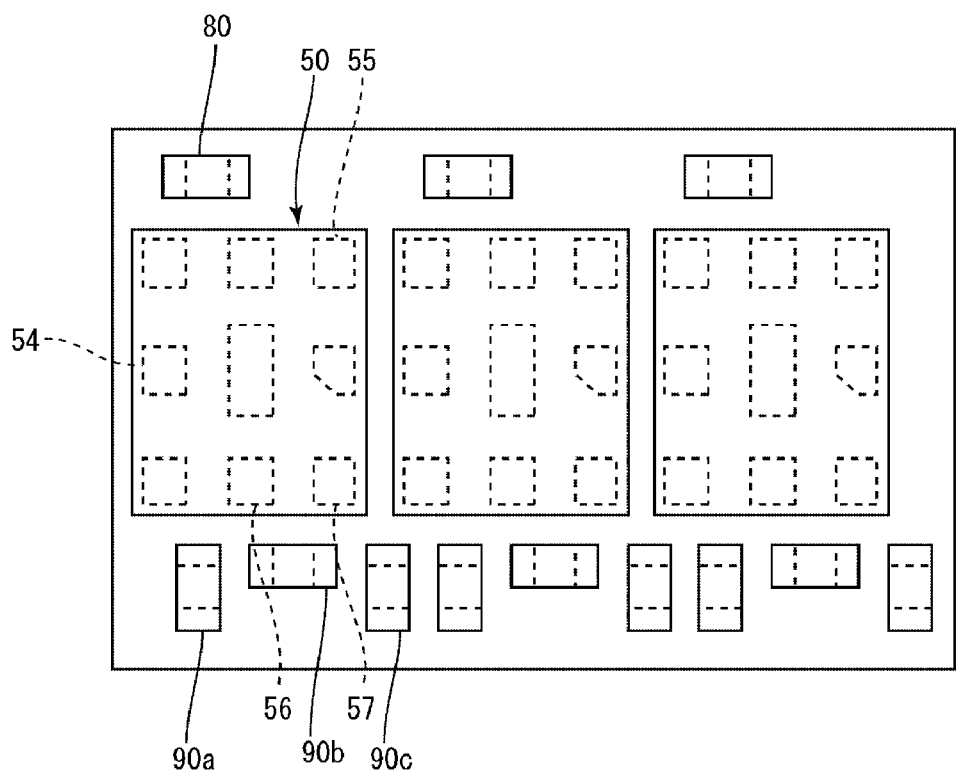
FIG. 43 is a plan view of a high-frequency module according to the sixth preferred embodiment of the present invention.
Figure 44:
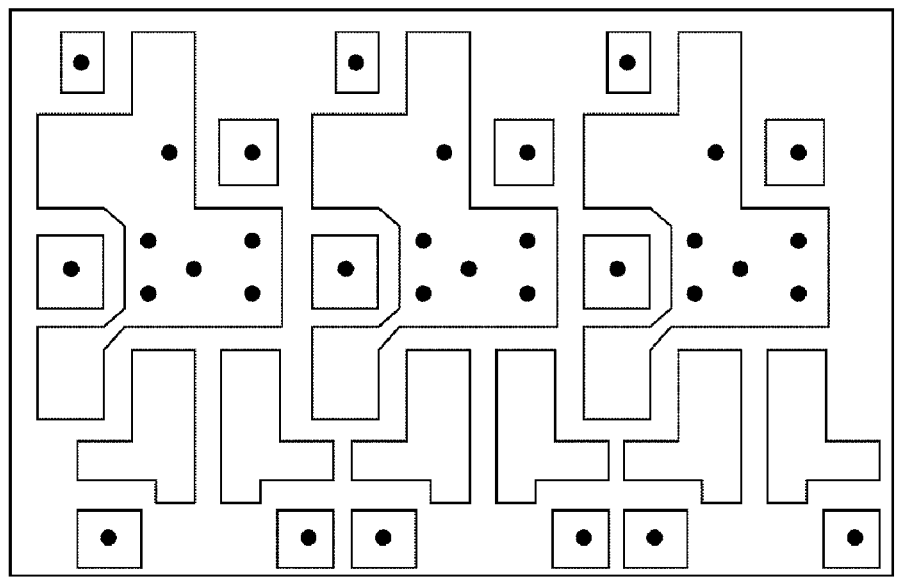
FIG. 44 is a plan view of a mounting surface of a first substrate according to the sixth preferred embodiment of the present invention.
Figure 45:
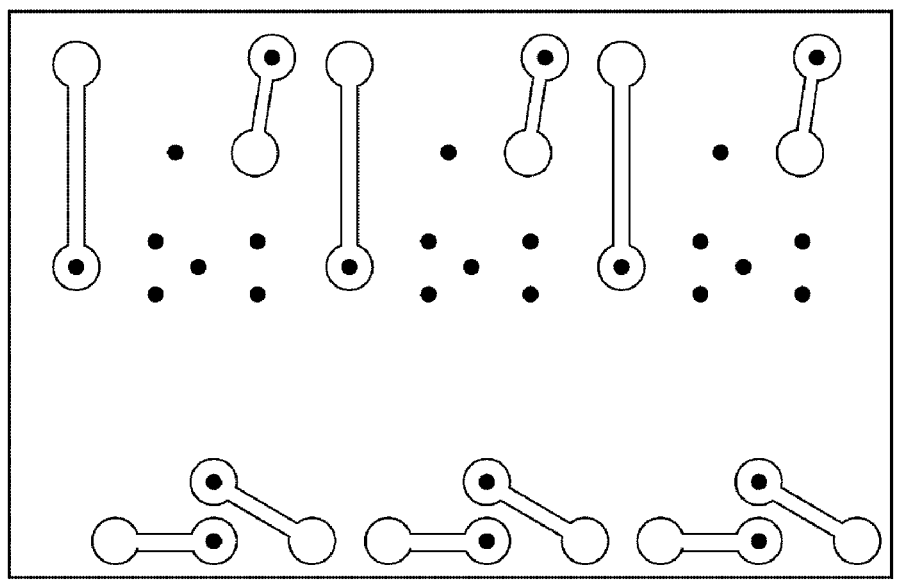
FIG. 45 is a plan view of the first principal surface of a second substrate according to the sixth preferred embodiment of the present invention.
Figure 46:
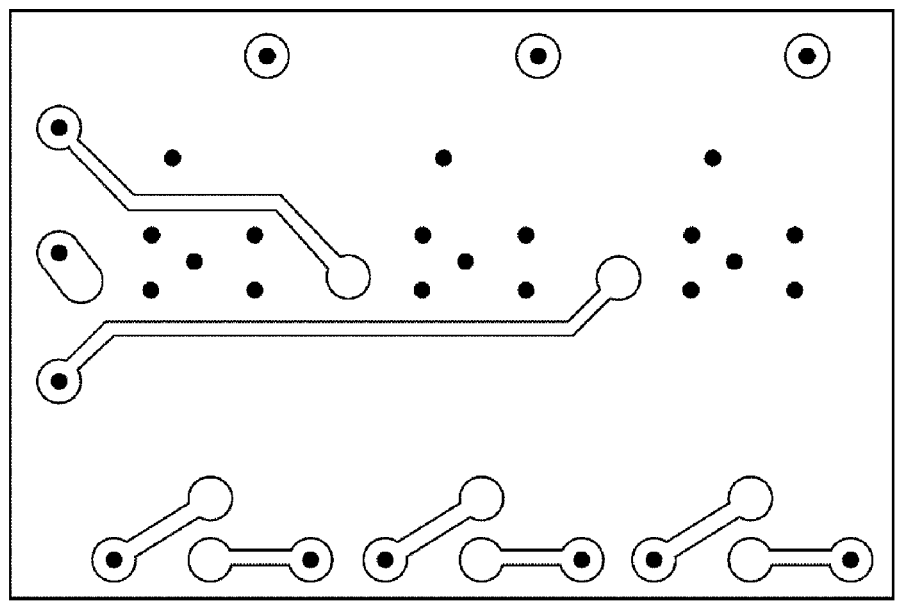
FIG. 46 is a plan view of the first principal surface of a third substrate according to the sixth preferred embodiment of the present invention.
Figure 47:
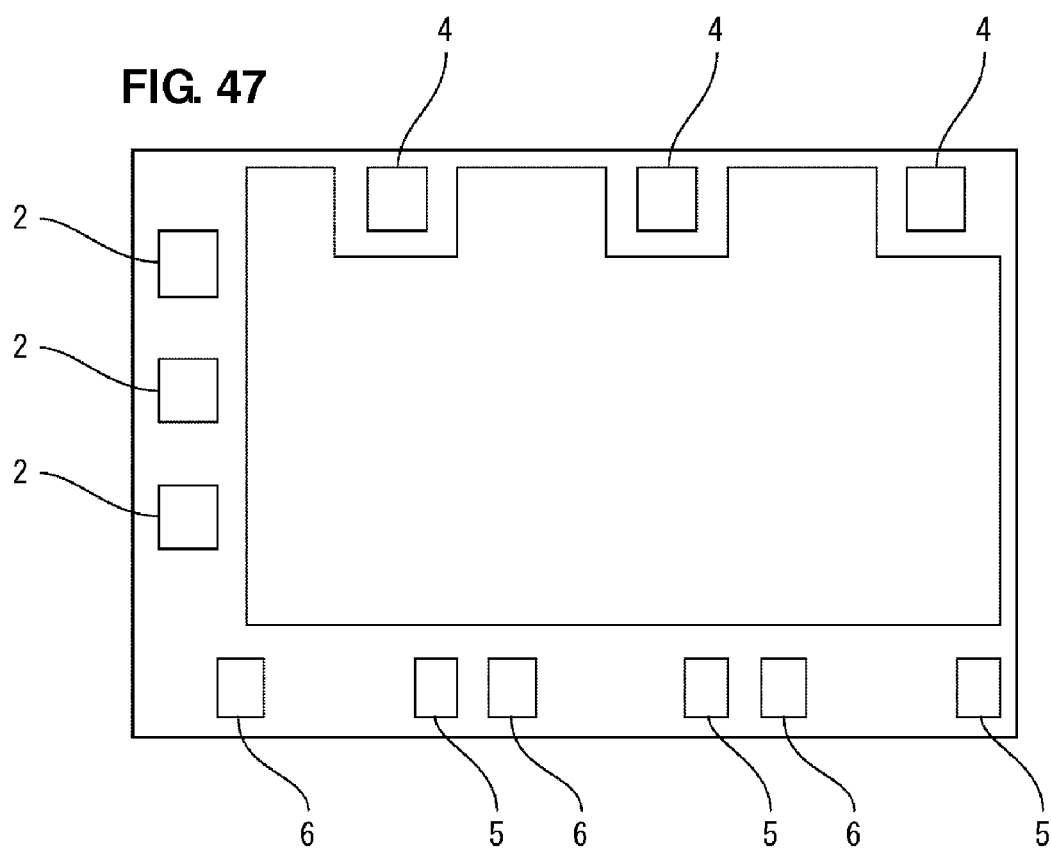
FIG. 47 is a bottom view of the high-frequency module according to the sixth preferred embodiment of the present invention.

Note that according to the fifth preferred embodiment, the first terminal 82 of the inductor chip 80 shown in FIG. 38 is connected to an electrode 11*v* shown in FIG. 39. The electrode 11*v* is connected to the electrode 12*c* shown in FIG. 40 using a via electrode 11*w*. Other connections are the same as those of the other preferred embodiments. That is, the antenna terminal 54 is connected to the antenna terminal 2 via the electrode 11*c*, the via electrode 11*d*, the electrode 12*c*, the via electrode 12*d*, the electrode 13*c*, and a via electrode 13*d*. The transmitting side signal terminal 55 is connected to the first transmitting side signal terminal 4 via the electrode 11*e*, the via electrode 11*f*, the electrode 12*e*, the via electrode 12*f*, the electrode 13*e*, and the via electrode 13*f*. The first balanced signal terminal 56 is connected to the first balanced signal terminal 5 via the electrode 11*g*, the via electrode 11*h*, the electrode 12*g*, the via electrode 12*h*, the electrode 13*g*, and the via electrode 13*h*. The second balanced signal terminal 57 is connected to the second balanced signal terminal 6 via the electrode 11*i*, the via electrode 11*j*, the electrode 12*i*, the via electrode 12*j*, the electrode 13*i*, and the via electrode 13*j*.

Sixth Preferred Embodiment

As shown in FIGS. 43 to 47, according to the sixth preferred embodiment of the present invention, a high-frequency module preferably includes matching circuit chips 90*a*, 90*b*, and 90*c* in addition to the structure of the high-frequency module according to the fifth preferred embodiment. Even in such a case, similar to the first to third preferred embodiments, the differential isolation and differential attenuation are improved. Note that according to the sixth preferred embodiment, similar to the third preferred embodiment, the matching circuit chip 90*b* is preferably connected between the first balanced signal terminal and the second balanced signal terminal on the third front surface side electrode pad and the fourth front surface side electrode pad formed on the mounting surface of a circuit board.

Seventh Preferred Embodiment

Figure 48:
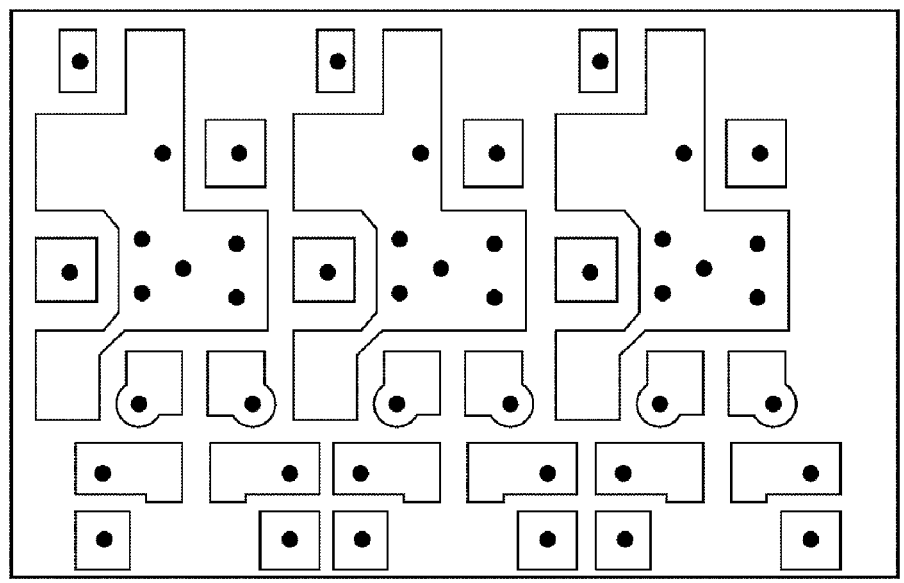
FIG. 48 is a plan view of a mounting surface of a first substrate according to a seventh preferred embodiment of the present invention.
Figure 49:
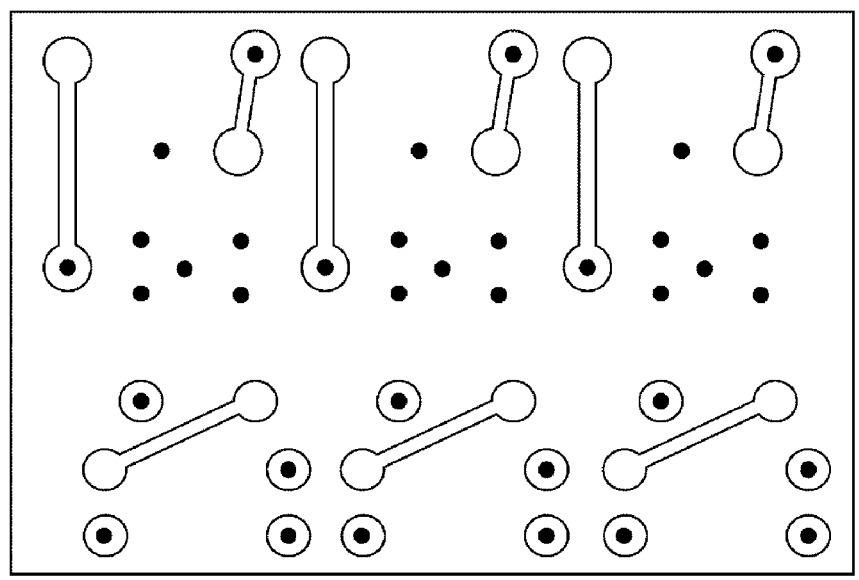
FIG. 49 is a plan view of the first principal surface of a second substrate according to the seventh preferred embodiment of the present invention.
Figure 50:
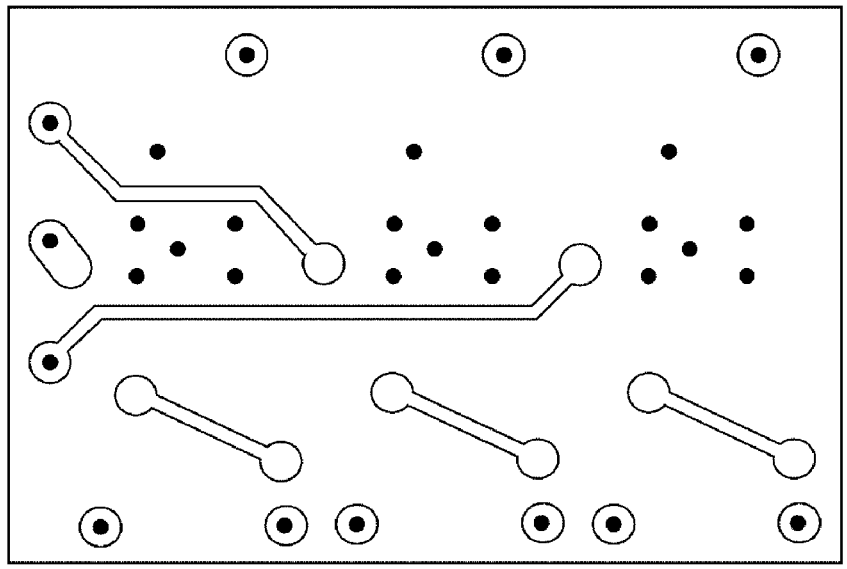
FIG. 50 is a plan view of the first principal surface of a third substrate according to the seventh preferred embodiment of the present invention.

FIGS. 48 to 50 illustrate a high-frequency module according to the seventh preferred embodiment of the present invention. Note that FIGS. 43 to 47 of the sixth preferred embodiment are also applied to the seventh preferred embodiment. According to the seventh preferred embodiment, a high-frequency module has a configuration that is similar to that of the high-frequency module according to the sixth preferred embodiment except for the connection arrangements of the matching circuit chip 90*a*, 90*b*, and 90*c*. Similar the fourth preferred embodiment, according to the seventh preferred embodiment, the matching circuit chip 90*b* is preferably connected between the first interconnection line and the second interconnection line provided inside the circuit board, and the matching circuit chip 84 is preferably connected between the first and second balanced signal terminals. Even in such a case, similar to the first to third preferred embodiments, the differential isolation and differential attenuation are improved.

Modifications of preferred embodiments of the present invention are further described below. Note that components of the modifications having functions substantially the same as those of the above-described preferred embodiments are denoted by the same reference numerals as those used for corresponding components of the above-described preferred embodiments, and the descriptions thereof are not repeated.

Figure 51:
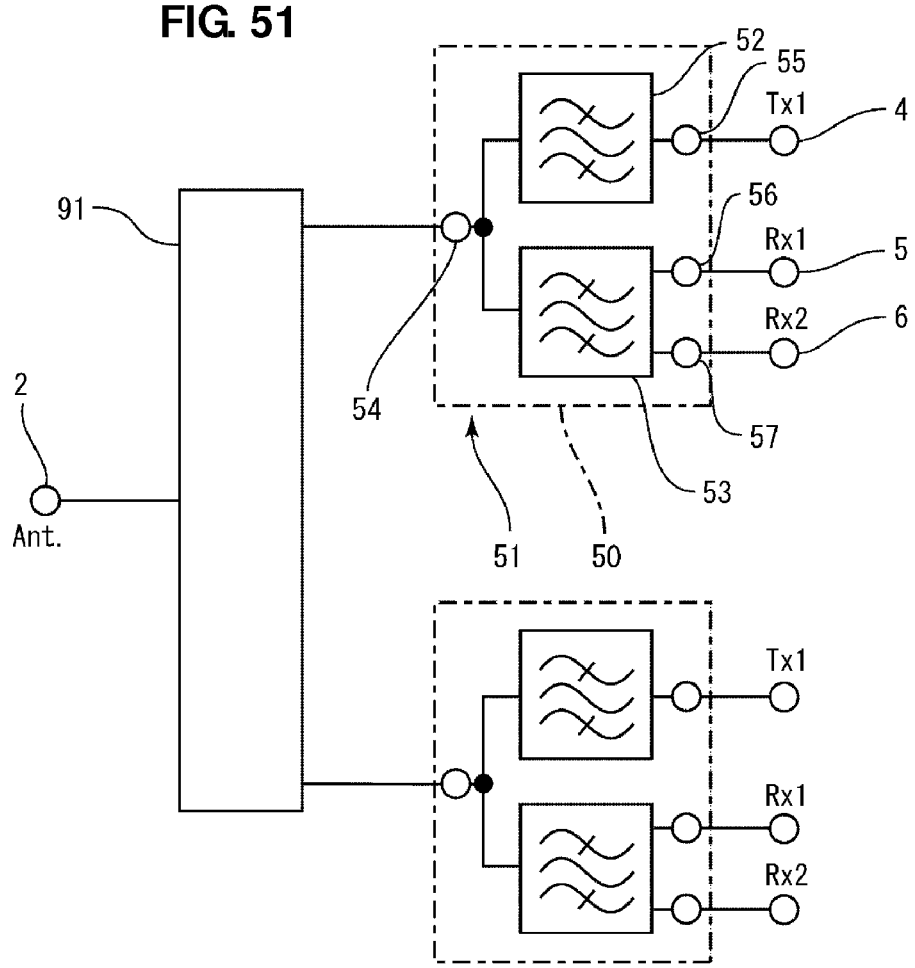
FIG. 51 is a schematic equivalent circuit diagram of a high-frequency module according to a first modification of a preferred embodiment of the present invention.

FIG. 51 is a schematic equivalent circuit diagram of a high-frequency module according to a first modification of a preferred embodiment of the present invention. As shown in FIG. 51, a high-frequency switch 91 may preferably be provided between the antenna terminal 2 and each of the transmitting side filter 52 and the receiving side filter 53.

Figure 52:
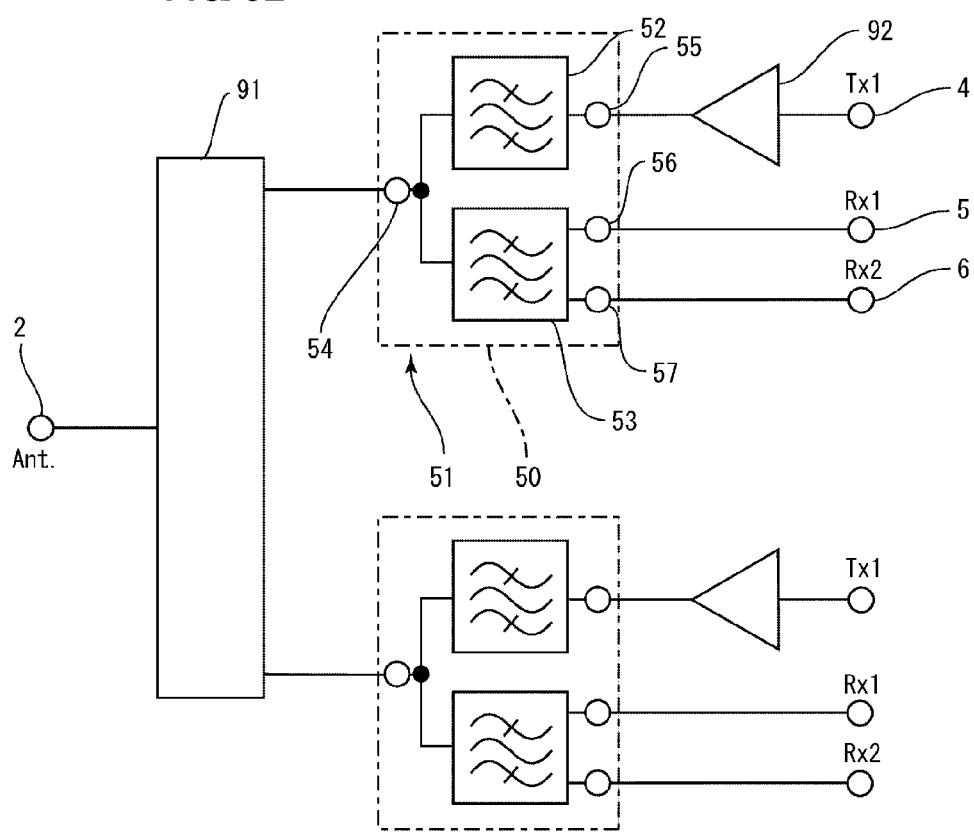
FIG. 52 is a schematic equivalent circuit diagram of a high-frequency module according to a second modification of a preferred embodiment of the present invention.

FIG. 52 is a schematic equivalent circuit diagram of a high-frequency module according to a second modification of a preferred embodiment of the present invention. As shown in FIG. 52, a power amplifier 92 connected to the transmitting side signal terminal 55 may preferably be provided. More specifically, according to the second modification, the power amplifier 92 is preferably connected between the transmitting side signal terminal 55 and the transmitting side signal terminal 4.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
a circuit board; and
a demultiplexer mounted on the circuit board, the demultiplexer including an antenna terminal, a transmitting side signal terminal, first and second balanced signal terminals defining a receiving side signal terminal, a transmitting side filter connected between the antenna terminal and the transmitting side signal terminal, and a receiving side filter connected between the antenna terminal and each of the first and second balanced signal terminals, the receiving side filter being arranged to perform a balanced-unbalanced conversion function; wherein
the circuit board includes a first principal surface on which the demultiplexer is mounted and a second principal surface that faces the first principal surface;
the first principal surface includes a first front surface side electrode pad to which the antenna terminal is connected, a second front surface side electrode pad to which the transmitting side signal terminal is connected, a third front surface side electrode pad to which the first balanced signal terminal is connected, and a fourth front surface side electrode pad to which the second balanced signal terminal is connected provided thereon;
the second principal surface includes a first back surface side electrode pad connected to the first front surface side electrode pad, a second back surface side electrode pad connected to the second front surface side electrode pad, a third back surface side electrode pad connected to the third front surface side electrode pad, and a fourth back surface side electrode pad connected to the fourth front surface side electrode pad provided thereon;
a distance from either the antenna terminal or the transmitting side signal terminal to the first balanced signal terminal is greater than a distance from either the antenna terminal or transmitting side signal terminal to the second balanced signal terminal; and
a distance from either the first or second back surface side electrode pads to the third back surface side electrode pad is less than a distance from either the first or second back surface side electrode pads to the fourth back surface side electrode pad.

2. The high-frequency module according to claim 1, wherein
the distance between the antenna terminal and the first balanced signal terminal is greater than the distance between the antenna terminal and the second balanced signal terminal;
the distance between the first back surface side electrode pad and the third back surface side electrode pad is less than the distance between the first back surface side electrode pad and the fourth back surface side electrode pad;
the distance between the transmitting side signal terminal and the first balanced signal terminal is greater than the distance between the transmitting side signal terminal and the second balanced signal terminal; and
the distance between the second back surface side electrode pad and the third back surface side electrode pad is less than the distance between the second back surface side electrode pad and the fourth back surface side electrode pad.

3. The high-frequency module according to claim 1, wherein
the distance between the antenna terminal and the first balanced signal terminal is greater than the distance between the antenna terminal and the second balanced signal terminal;
the distance between the first back surface side electrode pad and the third back surface side electrode pad is less than the distance between the first back surface side electrode pad and the fourth back surface side electrode pad;
the distance between the transmitting side signal terminal and the first balanced signal terminal is less than the distance between the transmitting side signal terminal and the second balanced signal terminal; and
the distance between the second back surface side electrode pad and the third back surface side electrode pad is greater than the distance between the second back surface side electrode pad and the fourth back surface side electrode pad.

4. The high-frequency module according to claim 1, wherein
the distance between the transmitting side signal terminal and the first balanced signal terminal is greater than the distance between the transmitting side signal terminal and the second balanced signal terminal;
the distance between the second back surface side electrode pad and the third back surface side electrode pad is less than the distance between the second back surface side electrode pad and the fourth back surface side electrode pad.

5. The high-frequency module according to claim 1, further comprising:
a first interconnection line connecting the third front surface side electrode pad to the third back surface side electrode pad; and
a second interconnection line connecting the fourth front surface side electrode pad to the fourth back surface side electrode pad; wherein
the first interconnection line intersects with the second interconnection line and the first interconnection line and the second interconnection line are insulated from each other.

6. The high-frequency module according to claim 1, wherein the demultiplexer is a triplexer that further includes a second transmitting side signal terminal and a second transmitting side filter disposed between the antenna terminal and the second transmitting side signal terminal.

7. The high-frequency module according to claim 1, wherein the demultiplexer is a multi-band duplexer including a plurality of duplexers, each including the antenna terminal, the transmitting side signal terminal, the first and second balanced signal terminals, the transmitting side filter, and the receiving side filter.

8. The high-frequency module according to claim 1, wherein the demultiplexer further includes a high-frequency switch connected between the antenna terminal and the transmitting side filter and the receiving side filter.

9. The high-frequency module according to claim 1, further comprising:

a power amplifier connected to the transmitting side signal terminal.

10. The high-frequency module according to of claim 5, further comprising:

a matching circuit connected between the first and second balanced signal terminals.

11. The high-frequency module according to claim 5, further comprising:

a matching circuit connected between a point of the first interconnection line on a side of the third back surface side electrode pad with respect to an intersection of the first interconnection line and the second interconnection line and a point of the second interconnection line on a side of the fourth front surface side electrode pad with respect to the intersection of the second interconnection line and the first interconnection line.

* * * * *